(12) United States Patent
Sakai et al.

(10) Patent No.: US 6,194,236 B1
(45) Date of Patent: Feb. 27, 2001

(54) ELECTROCHEMICAL ETCHING METHOD FOR SILICON SUBSTRATE HAVING PN JUNCTION

(75) Inventors: Minekazu Sakai, Kariya; Tsuyoshi Fukada, Aichi-gun; Yukihiko Tanizawa, Kariya; Koki Mizuno; Yasutoshi Suzuki, both of Okazaki; Yoshitsugu Abe, Anjo; Hiroshi Tanaka, Toyokawa; Motoki Ito, Nagoya; Kazuhisa Ikeda, Chiryu; Hiroshi Okada, Nukata-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/247,908

(22) Filed: Feb. 11, 1999

Related U.S. Application Data

(60) Division of application No. 08/637,128, filed on Apr. 24, 1996, now Pat. No. 5,949,118, which is a continuation-in-part of application No. 08/402,846, filed on Mar. 13, 1995, now abandoned.

(30) Foreign Application Priority Data

Mar. 14, 1994 (JP) .......................................... 6-42839
Apr. 24, 1995 (JP) .......................................... 7-98949
Sep. 19, 1995 (JP) .......................................... 7-239927

(51) Int. Cl.$^7$ ............................ H01L 21/66; G01R 31/26
(52) U.S. Cl. ............................ 438/17; 438/53; 438/701; 438/977; 438/753
(58) Field of Search ........................... 438/977, 53, 753, 438/381, 13, 17, 701

(56) References Cited

U.S. PATENT DOCUMENTS

| | | | |
|---|---|---|---|
| 4,618,397 | 10/1986 | Shimizu et al. | ........................ 438/53 |
| 4,664,762 | 5/1987 | Hirata | .................................. 205/157 |
| 4,889,590 | * 12/1989 | Tucker et al. | .......................... 156/647 |

(List continued on next page.)

FOREIGN PATENT DOCUMENTS

| | | |
|---|---|---|
| 567 075 | 10/1993 | (EP) . |
| 59-013377 | 1/1984 | (JP) . |

(List continued on next page.)

OTHER PUBLICATIONS

Kloeck, et al., "Study of Electrochemical Etch–Stop for High–Precision Thickness Control of Silicon Membranes", IEEE Transactions on Electron Devices (1989) Apr., vol. 36, No. 4, pp. 663–669.

(List continued on next page.)

*Primary Examiner*—Olik Chaudhuri
*Assistant Examiner*—Kurt Eaton
(74) *Attorney, Agent, or Firm*—Pillsbury Madison & Sutro LLP

(57) ABSTRACT

An etching method for a silicon substrate, which can easily smooth the etching surface of the (110)-oriented silicon, is disclosed. A container is filled with KOH solution. In the KOH solution is immersed a (110)-oriented silicon wafer having a PN junction and is also disposed a platinum electrode plate to face the silicon wafer. To between a platinum electrode of the silicon wafer and the platinum electrode plate are connected a constant voltage power source, an ammeter and a contact in series. A controller starts etching from one surface on which the PN junction is formed, and terminates voltage application when the specified time lapses after the formation of an anodic oxide film is equilibrated with the etching of the anodic oxide film on the etching surface on the PN junction part. In this case, the controller detects flowing current through the ammeter, and the point of time when the equilibrium state is obtained is the point of inflection of the detected current to the constant current after the peak thereof.

14 Claims, 32 Drawing Sheets

U.S. PATENT DOCUMENTS

| | | | |
|---|---|---|---|
| 4,995,953 | 2/1991 | Yee | 205/656 |
| 4,996,627 | 2/1991 | Zias et al. | 361/283.4 |
| 5,071,510 * | 12/1991 | Findler et al. | 156/647 |
| 5,167,778 | 12/1992 | Kaneko et al. | 205/656 |
| 5,223,086 | 6/1993 | Terada et al. | 438/51 |
| 5,231,301 | 7/1993 | Peterson et al. | 257/419 |
| 5,242,533 * | 9/1993 | Trah et al. | 156/628 |
| 5,289,721 | 3/1994 | Tanizawa et al. | 73/727 |
| 5,296,730 | 3/1994 | Takano et al. | 257/417 |
| 5,387,316 * | 2/1995 | Pennell et al. | 156/647 |
| 5,445,718 | 8/1995 | Wang | 205/646 |
| 5,514,898 | 5/1996 | Hartauer | 257/417 |
| 5,525,549 | 6/1996 | Fukada et al. | 438/53 |
| 5,643,803 | 7/1997 | Fukada et al. | 438/50 |

FOREIGN PATENT DOCUMENTS

| | | |
|---|---|---|
| 60-013314 | 4/1985 | (JP) . |
| 62-060270 | 3/1987 | (JP) . |
| 2-278772 | 11/1990 | (JP) . |
| 3-037749 | 6/1991 | (JP) . |
| 4-239184 | 8/1992 | (JP) . |
| 5-196525 | 8/1993 | (JP) . |
| 5-66728 | 9/1993 | (JP) . |
| 6-260660 | 9/1994 | (JP) . |
| 7-037856 | 2/1995 | (JP) . |

OTHER PUBLICATIONS

Sarro, et al: "Silicon Cantilever Beams Fabricated by Electrochemically Controlled Etching for Sensor Applications", Journal of the Electrochemical Society, vol.133, No. 8, Aug. 1986, pp. 1724–1729.

Kim, et al: "Temperature Sensitivity in Silicon Piezoresistive Pressure Transducers", IEEE Transactions on Electron Devices, vol. ED–30, No. 7, Jul. 1983, pp. 802–810.

Patent Abstracts of Japan, vol. 011, No. 249, (E–532) Aug. 13, 1987, & JP–A–62 061 374, Mar. 18, 1987.

Journal of Nippondenso Technical Disclosure 88–002 See also Application p. 2.

Jackson, et al: "An Electrochemical P–N Junction Etch–Stop for the Formation of Silicon Microstructures", IEEE Electron Device Letters, vol. EDL–2, No. 2, Feb. 1981, pp. 44–45.

* cited by examiner

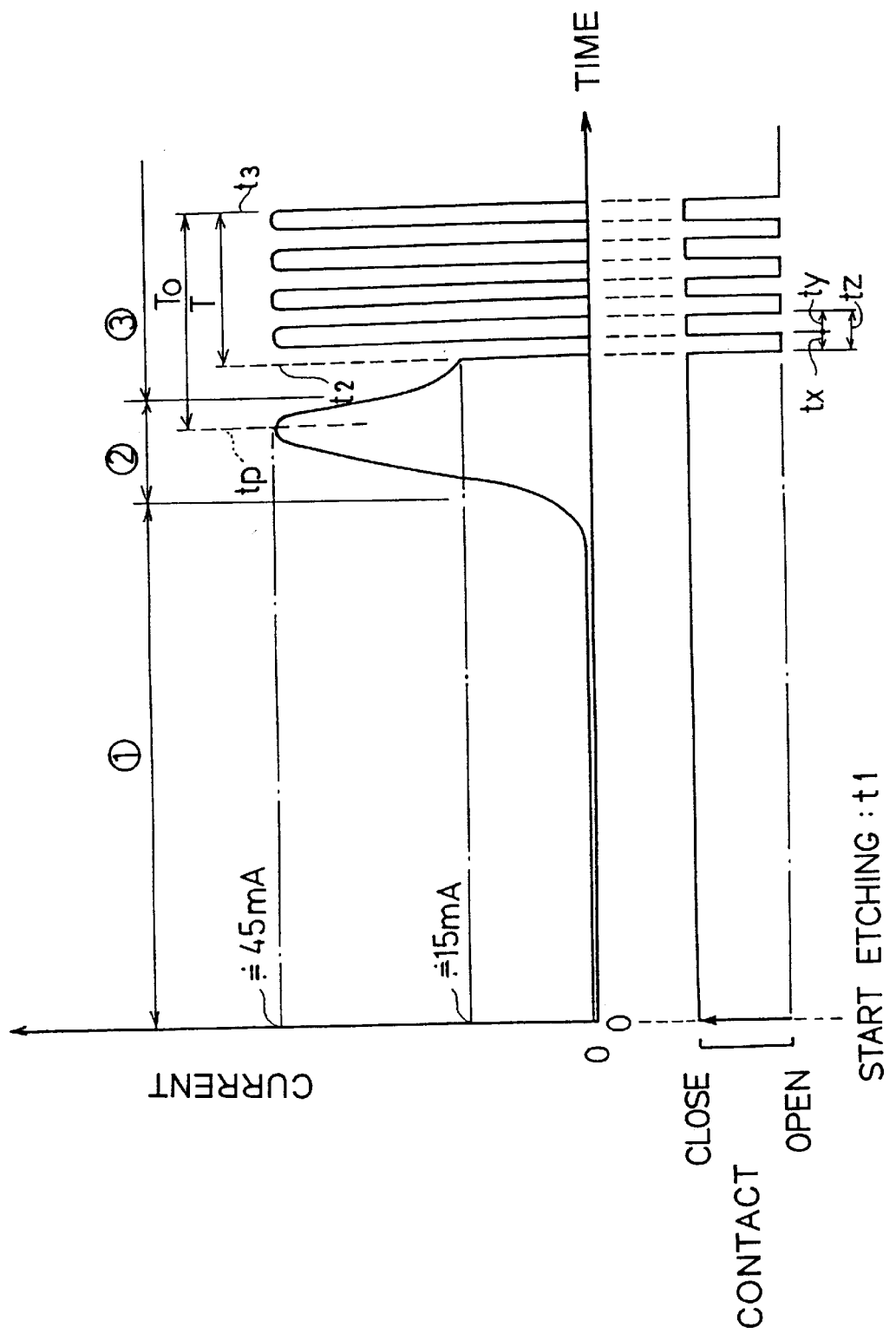

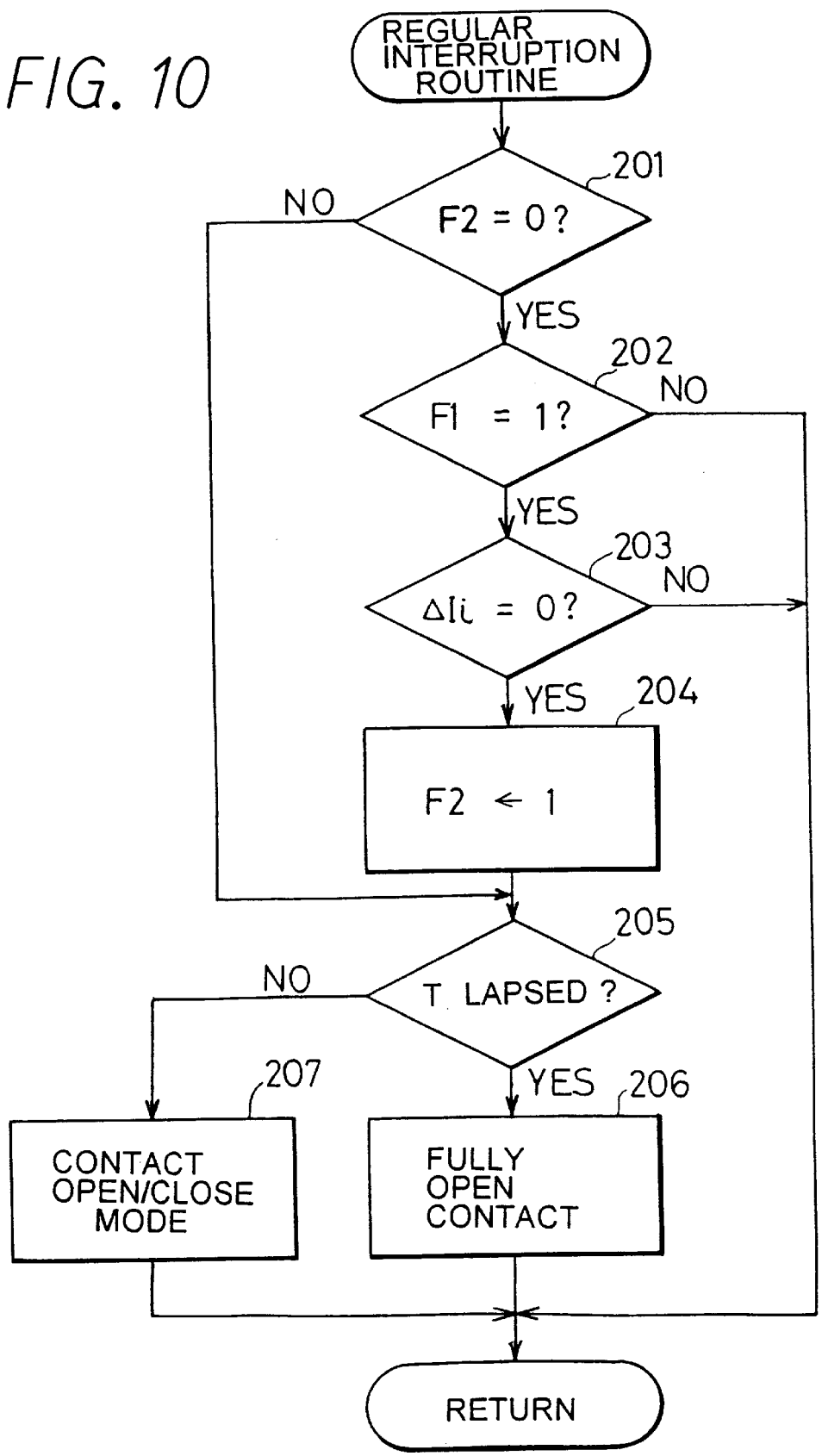

SILICON

ANODIC OXIDE FILM
SILICON

ANODIC OXIDE FILM
SILICON

ANODIC OXIDE FILM
SILICON

ANODIC OXIDE FILM
SILICON

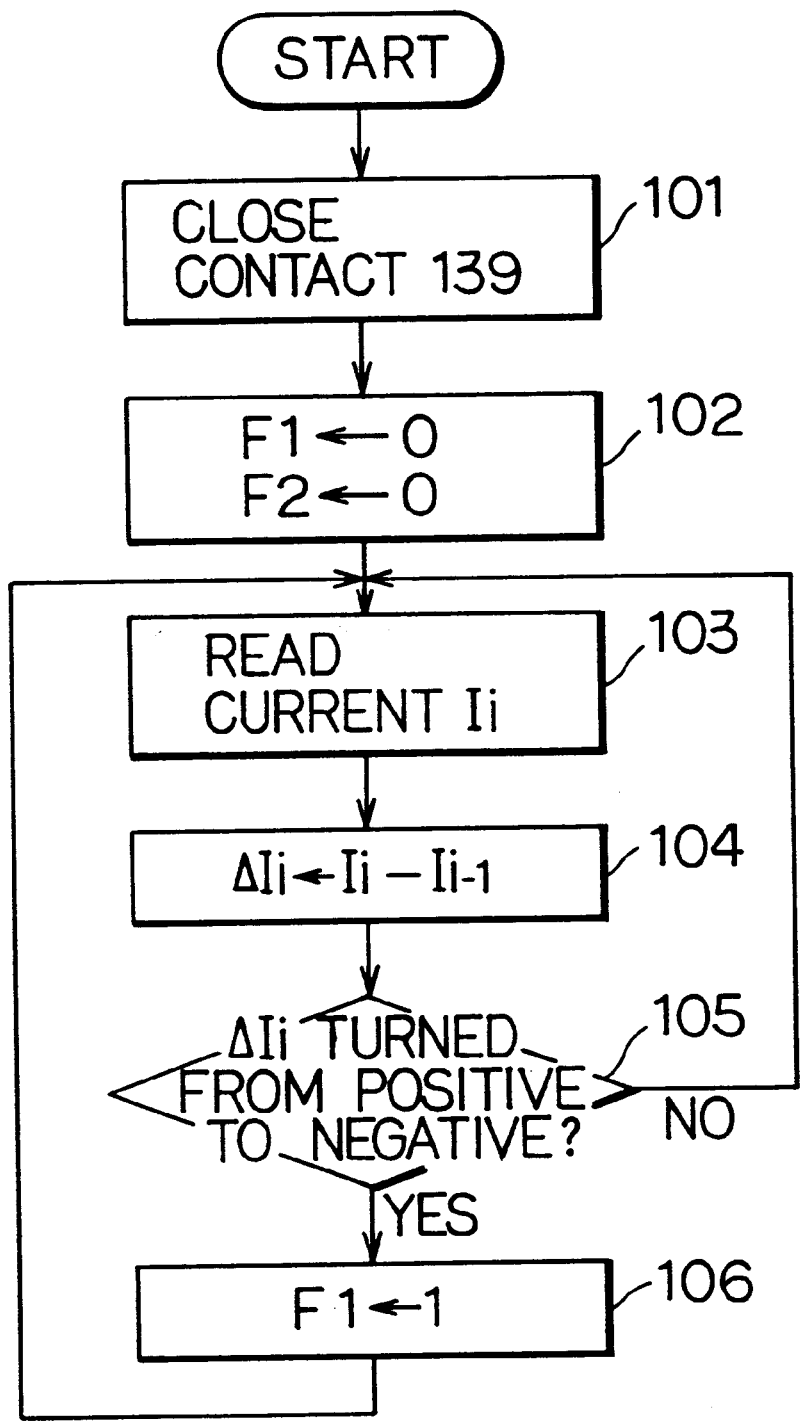

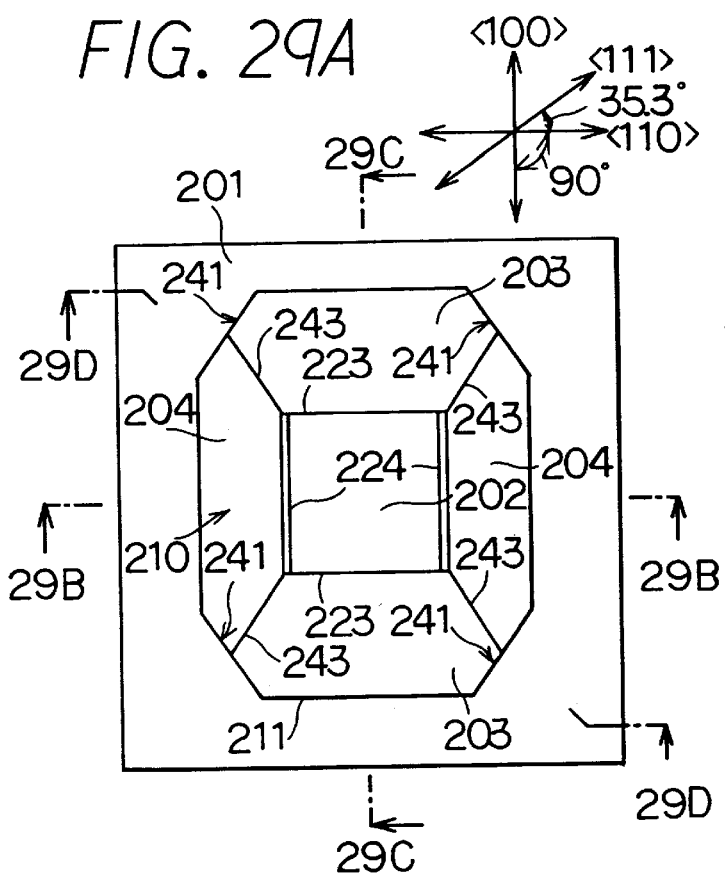
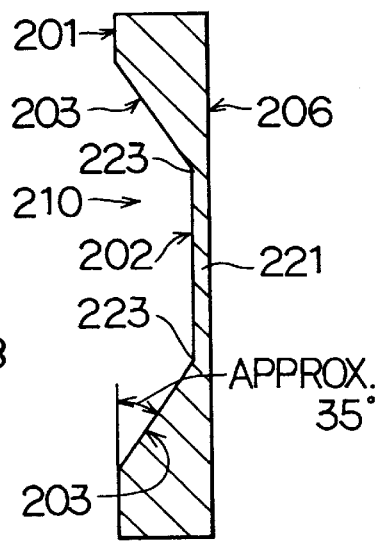
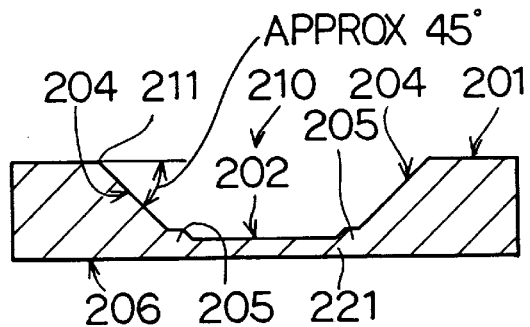
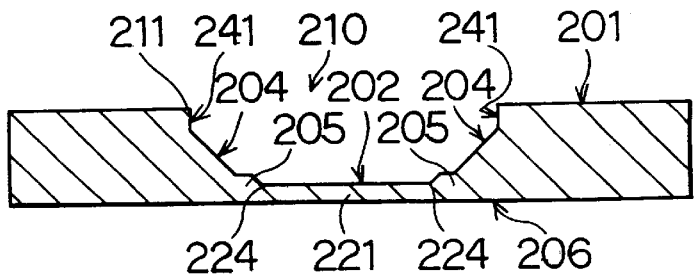

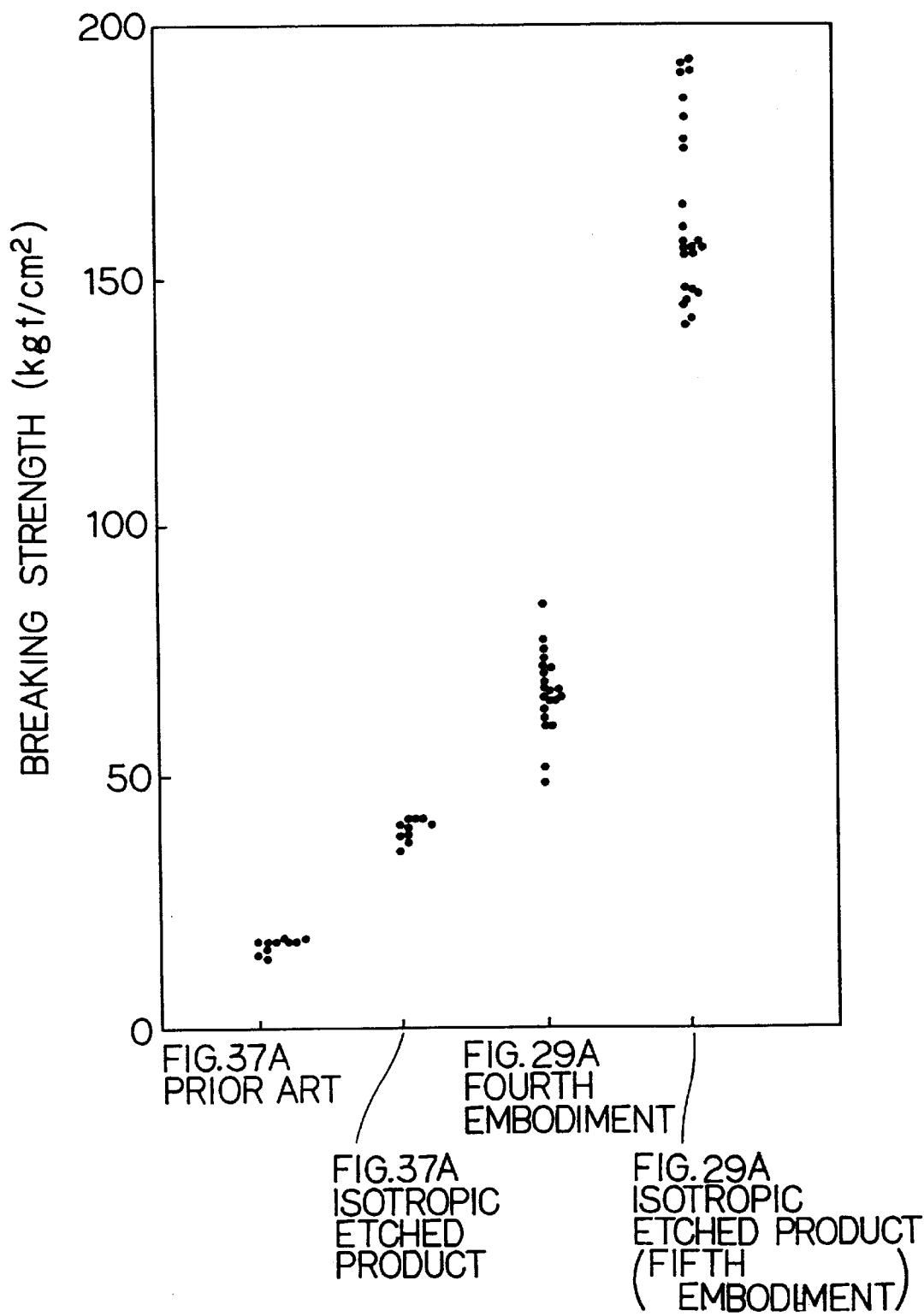

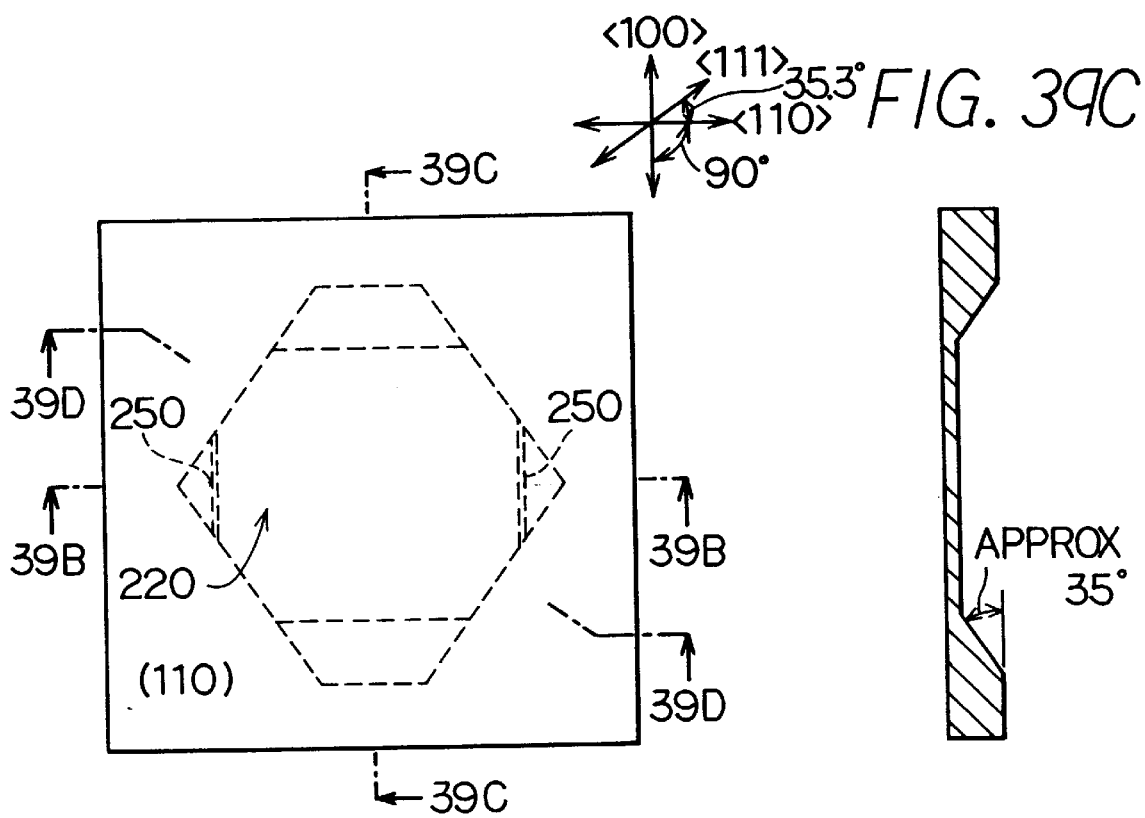
FIG. 39A
FIG. 39C
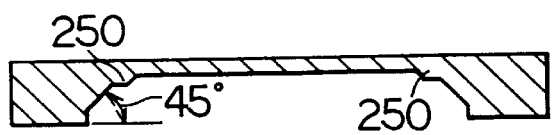
FIG. 39B
FIG. 39D

ELECTROCHEMICAL ETCHING METHOD FOR SILICON SUBSTRATE HAVING PN JUNCTION

CROSS REFERENCE TO RELATED APPLICATION

This application is a Div. of U.S. application Ser. No. 08/637,128 filed Apr. 24, 1996, now U.S. Pat. No. 5,949,118, which is a CIP of 08/402,846, now abandoned and claims priority from Japanese Patent Application Nos. (Hei) 7-98949 and No. (Hei) 7-239927, incorporated herein by reference. It is related to those applications and Japanese Patent Application No. (Hei) 6-42839, also incorporated herein by reference.

BACKGROUND OF THE INVENTION

1. Field of the Invention

The present invention generally relates to an etching method for silicon substrates. More particularly, the present invention relates to an etching method for silicon substrates used for forming thinned portions of semiconductor sensors, e.g., a pressure sensor and an acceleration sensor.

2. Related Arts

In the conventional technique of manufacturing semiconductor pressure sensors, anisotropic etching using KOH is used for forming a thin diaphragm on a portion of a (110)-oriented silicon substrate, i.e., the (110)-oriented silicon substrate is etched by KOH through time control. However, due to the nature of the (110)-oriented silicon, this method results in the rough etching surface which causes unevenness to the characteristics of semiconductor pressure sensors. For this reason, there has been a need to smooth the etching surface.

As a solution to this problem, a $SiO_2$ (SP—$SiO_2$) film formed by the spattering method is provided on the etching surface on which a diaphragm has been formed as disclosed in the Journal of NIPPONDENSO Technical Disclosure No. 88-002, published on Jan. 15, 1993.

However, this method of providing the SP—$SiO_2$ film requires another component material in addition to the silicon substrate and additional processes. Furthermore, even if electrochemical etching is used for etching the (110)-oriented silicon surface like etching a (100)-oriented silicon surface, the resultant etching surface is rough.

SUMMARY OF THE INVENTION

In view of the above, it is a primary object of the present invention to provide an etching method for silicon substrates which can easily smooth the etching surface of the (110)-oriented silicon.

The summary of an etching method for silicon substrates according to the present invention is that in electrochemically etching a (110)-oriented silicon substrate having PN junction by using anisotropic etchant, etching is started from one surface on which the PN junction is formed, and voltage application is terminated when the specified time lapses after the formation of an anodic oxide film is equilibrated with the etching of the anodic oxide film on the etching surface on the PN junction part.

Incidentally, the point of time when the above equilibrium state is obtained is determined by detecting flowing current and then a point of inflection of the detected flowing current to constant current after the peak of the flowing current.

Furthermore, the point of inflection may be regarded as a point of time when the specified time has lapsed since the detection of the peak current.

It should be noted here that AC wave would preferably be used for voltage application for the specified time after the point of time when the equilibrium state is obtained. In this case, the cycle of the AC wave might preferably be the time required for removing all the anodic oxide film from the etching surface by using anisotropic etchant.

According to the present invention, though the etching surface has concave parts and convex parts when the formation of the anodic oxide film is equilibrated with the etching of the anodic oxide film on the etching surface on the PN junction part, the etching surface is smoothed by the subsequent voltage application. This is presumably for the reason that the anodic oxide film on the concave parts can not easily be etched and the anodic oxide film on the convex parts is easily etched on the concave parts and convex--parts of the etching surface, and as a result, the silicon on the convex parts is removed.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIG. 9 is a time chart for use in describing the operation of electrochemical etching according to a second embodiment;

FIG. 10 is a flow chart for use in describing the operation of electrochemical etching according to the second embodiment;

FIG. 18 is a flow chart for use in describing the operation of electrochemical etching;

FIGS. 29A, 29B, 29C and 29D are a plan view of a pressure sensor according to a fourth embodiment, a cross-sectional view thereof taken along line 29B—29B of FIG. 29A, a cross-sectional view thereof taken along line 29C—29C of FIG. 29A, and a cross-sectional view thereof taken along line 29D—29D of FIG. 29A, respectively;

FIG. 38 is a graph showing the improvement in break strength; and

FIGS. 39A, 39B, 39C and 39D are a plan view of a pressure sensor having the octagonal diaphragm of the application example, a cross-sectional view thereof taken along line 39B—39B of FIG. 39A, a cross-sectional view thereof taken along line 39C-39C of FIG. 39A, and a cross-sectional view thereof taken along line 39D—39D of FIG. 39A, respectively.

DETAILED DESCRIPTION OF THE PRESENTLY PREFERRED EXEMPLARY EMBODIMENTS

Hereinafter, the various embodiments which have embodied the present invention will be described referring to the appended drawings.

First Embodiment

This embodiment has embodied a semiconductor pressure sensor using a piezo-resistance layer.

Figure 1:
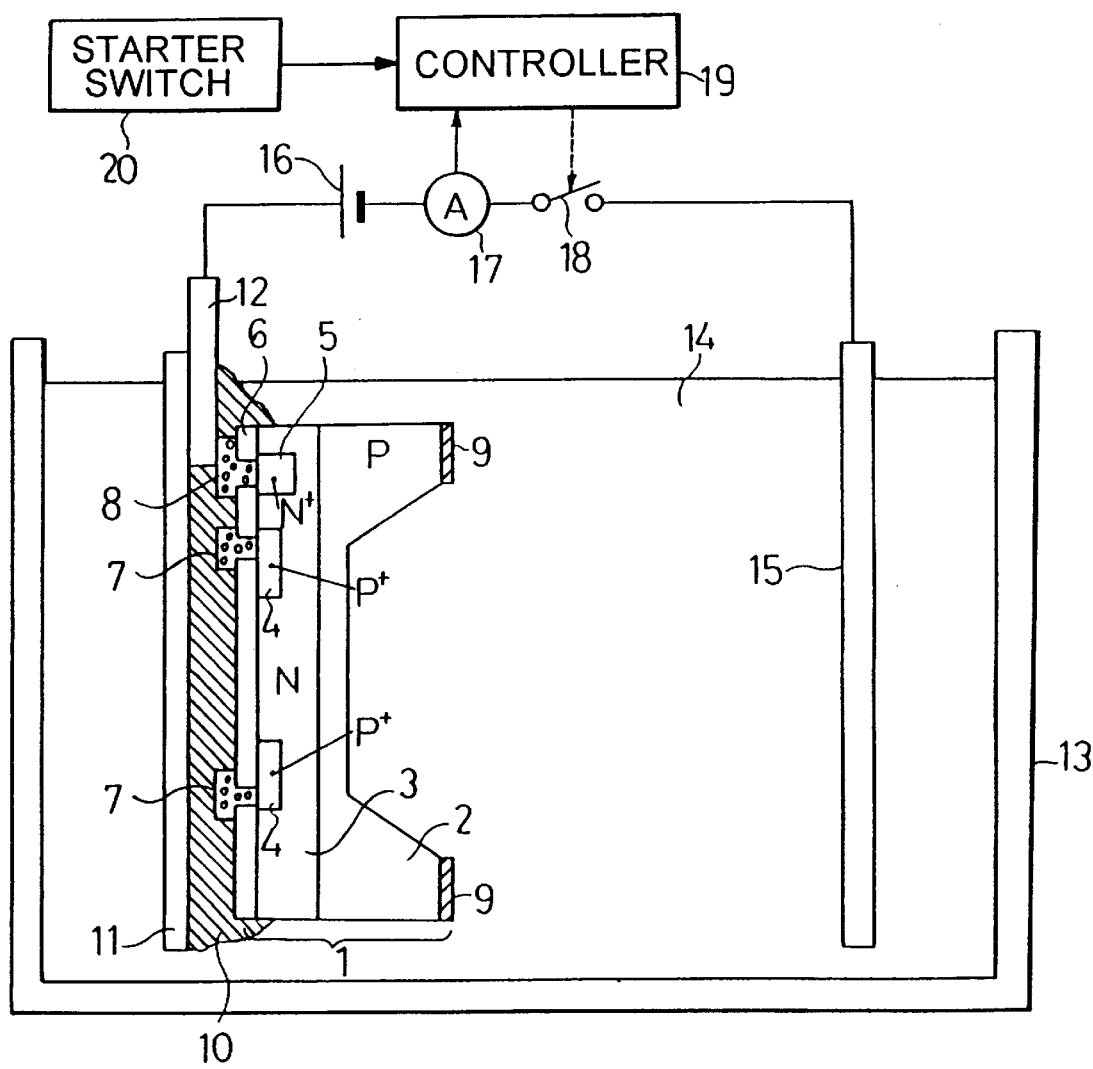
FIG. 1 is a schematic view of an electrochemical etching system according to a first embodiment.

FIG. 1 is a schematic of an electrochemical etching system for forming a diaphragm on a silicon wafer 1. In the first place, description will be given to the silicon wafer 1. All over a (110)-oriented silicon substrate 2 of P-type is formed an N-type epitaxial layer 3. In the N-type epitaxial layer 3 is formed a $P^+$-type impurity diffusion layer 4 which serves as a piezo-resistance layer for sensing strain. In the N-type epitaxial layer 3 is also formed an $N^+$-type impurity diffusion layer 5 which enables the N-type epitaxial layer 3 to take an ohmic contact. Furthermore, on the N-type epitaxial layer 3 is formed a silicon oxide film 6. The $P^+$-type impurity diffusion layer 4 and the $N^+$-type impurity diffusion layer 5 are electrically drawn to the surface side of the silicon oxide film 6 by aluminum wiring 7 and 8.

On the surface of the silicon substrate where the N-type epitaxial layer 3 is not formed is formed a mask material 9 on a region where the diaphragm is not to be formed.

The silicon wafer 1 as arranged in the above is ready for use. This silicon wafer 1 is fixed to a ceramic supporting substrate 11 with a platinum electrode .12 interposed therebetween. The surface of the silicon wafer 1 where etching is not to be provided (the surface where the N-type epitaxial layer 3 is to be formed) is protected with a resin wax 10. The platinum electrode 12 is in contact with the aluminum 8, that is, the platinum electrode 12 is electrically contacted with the N-type epitaxial layer 3 through the aluminum 8 and the $N^+$-type impurity diffusion layer 5 so that electrochemical stop etching can be performed.

On the other hand, a container 13 is filled with a KOH solution (33 wt %, 82° C.) 14. In the KOH solution 14 within the container 13 is immersed the above-described silicon wafer 1 and is disposed a platinum electrode plate 15 to face the silicon wafer 1.

Between the platinum electrode 12 on silicon wafer 1 and the platinum electrode plate 15 is serially connected a constant voltage (2V) power source 16, an ammeter 17 and a contact 18. To a controller 19 is connected a starter switch 20, the ammeter 17 and the contact 18. When the contact 18 closes, potential difference is applied to between the silicon wafer 1 and the platinum electrode plate 15 from the constant voltage (2V) power source 16. At this time, current flowing from the silicon wafer 1 to the platinum electrode plate 15 is detected by the ammeter 17. The controller 19 detects the start of etching by receiving a signal from the starter switch 20 and on the other hand, detects flowing current by receiving a signal from the ammeter 17. Furthermore, the controller 19 drives the contact 18 to open or close. This controller 19 is composed mainly of a microcomputer.

Figure 2:
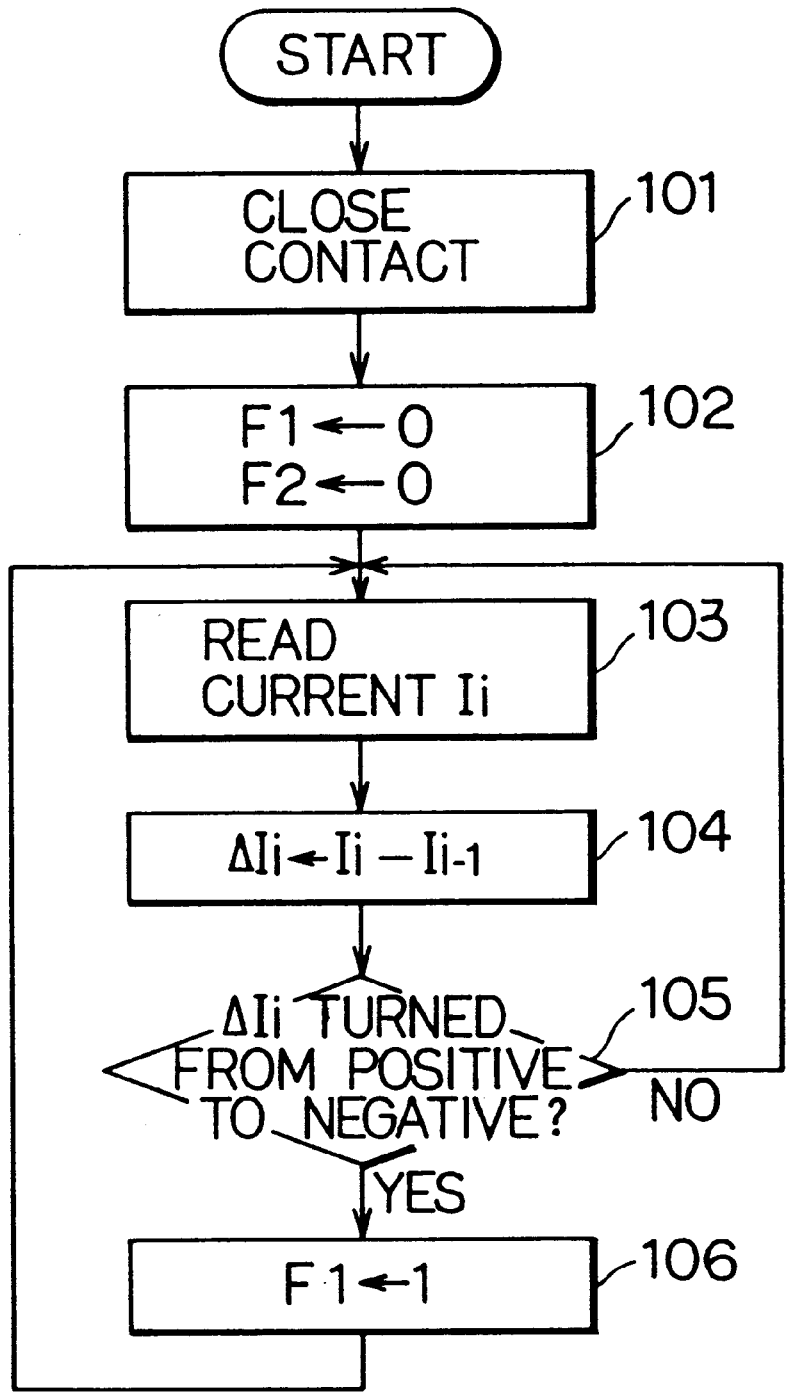
FIG. 2 is a flow chart for use in describing the operation of electrochemical etching.
Figure 3:
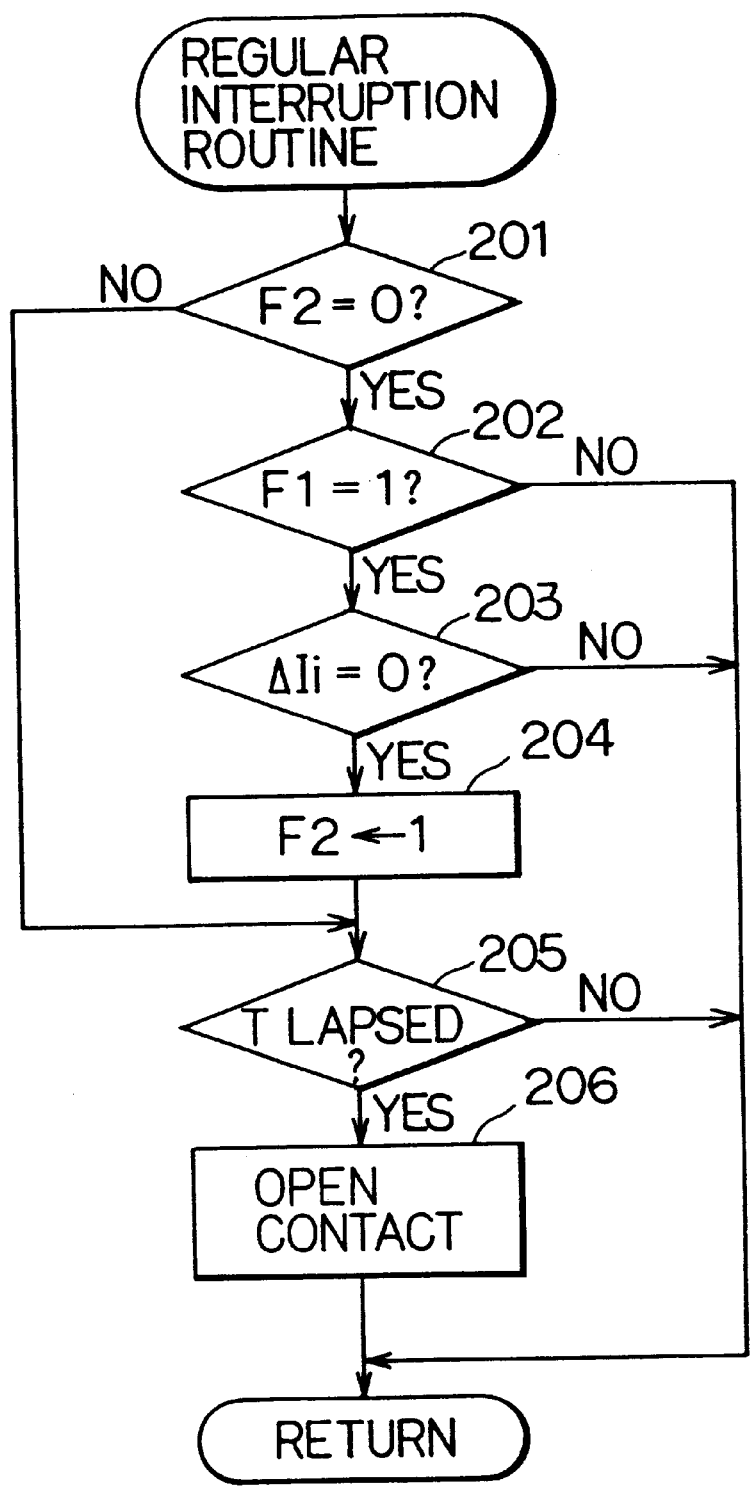
FIG. 3 is a flow chart for use in describing the operation of electrochemical etching.

The controller 19 executes a processing illustrated in FIGS. 2 and 3. This processing will now be described referring to a time chart illustrated in FIG. 4. Incidentally, in FIG. 4, the ordinate axis of the time chart indicates the flowing current value and the open/close state of the contact 18.

In the first place, when the controller 19 receives an etching start signal from the starter switch 20, the controller 19 starts the processing illustrated in FIG. 2. The controller 19 closes the contact 18 in Step 101, and set flags F1 and F2 to "0" in Step 102. Then, the controller 19 reads a present current value $I_i$ measured by the ammeter 17 in Step 103, and calculates the difference between the present current value $I_i$ and the previous current value $I_{i-1}$, $\Delta I_i$ $(=I_i-I_{i-1})$, in Step 104.

Figure 4:
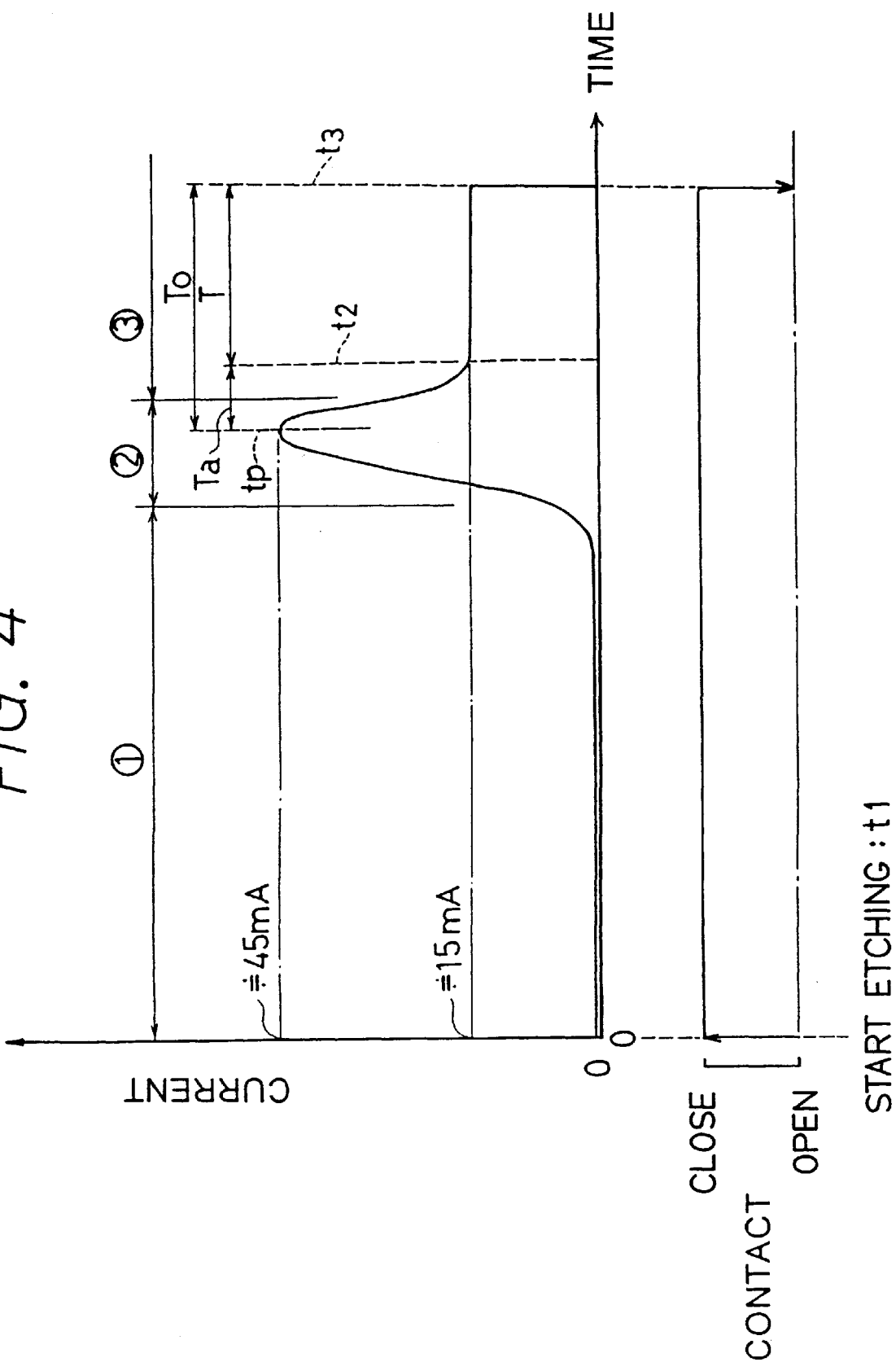
FIG. 4 is a time chart for use in describing the operation of electrochemical etching.

In Step 105, the controller 19 judges whether or not the variation $\Delta I_i$ in the flowing current has reversed from positive to negative, that is, whether or not the flowing current value has reached the peak (the timing tp in FIG. 4). When the controller 19 judges that the variation $\Delta I_i$ in the flowing current has not reversed from positive to negative, the controller 19 returns to Step 103. When the controller 19 judges that the variation $\Delta I_i$ has reversed from positive to negative, the controller 19 sets the flag F1 to "1" in Step 106.

On the other hand, the controller 19 executes the regular interruption routine illustrated in FIG. 3 every specified time. The controller 19 judges whether or not the flag F2 is "0" in Step 201. However, as the flag F2 is initially 0, the controller 19 proceeds to Step 202. Then, the controller 19 judges whether or not the flag F1 is "1" in Step 202. However, as the flag F1 is initially 0, the controller 19 returns to the processing of FIG. 2.

When the flowing current value has reached the peak (the timing tp in FIG. 4) and F1 is now equal to 1, the controller 19 proceeds from Step 202 to Step 203. In Step 203, the controller 19 judges whether or not the variation $\Delta I_i$ in the flowing current has turned to be "0." As $\Delta I_i$ is negative within a period from the timing tp to the timing t2 and $\Delta I_i$ is not equal to 0, the controller 19 returns to the processing of FIG. 2.

Subsequently, when the variation $\Delta I_i$ in the flowing current has turned to "0" (the timing t2 in FIG. 4), the controller 19 sets the flag F2 to "1." Furthermore, the controller 19 starts the timer in Step 205, and the controller 19 judges whether or not the specified time T (10 minutes in this embodiment) has lapsed since the time when the variation $\Delta I_i$ in the flowing current has turned to be "0." As the controller 19 judges that the time set by the timer has not lapsed the specified time T, the controller returns to the processing of FIG. 2. In the next and subsequent steps, however, as F2 is equal to 1, the controller 19 jumps from Step 210 to Step 205 when the controller 19 executes the regular interruption routine of FIG. 3 again.

In Step 205, when the specified time T has lapsed (the timing t3 in FIG. 4), the controller 19 proceeds to Step 206 and opens the contact 18 in FIG. 1 to terminate the current flow. Upon the termination of the current flow, the. silicon wafer 1 is removed from the KOH solution 14 and washed in water. This ends the electrochemical etching operation.

Next, the behavior of the flowing current will be described. Within the first period $\hat{1}$ immediately after the start of current flow, the etching of the P-type silicon substrate 2 progresses by the chemical reaction between the KOH and the silicon. This is for the reason that while voltage is applied to the aluminum 8, current is not supplied to the silicon wafer 1 due to the PN junction formed by the P-type silicon substrate 2 and the N-type epitaxial layer 3. Within the following second period $\hat{2}$, the flowing current has the peak thereof. Within the same second period $\hat{2}$, the anodic oxidation progresses due to the electrochemical reaction of the P-type silicon substrate 2. This is for the reason that when the silicon substrate 2 is etched and thereby the depletion layer extending from the PN junction contacts the KOH solution 14, current flows and the silicon is oxidized. In addition, the peak is gentle within the second period $\hat{2}$ due to the surface distribution of the thickness (unevenness in the thickness) of the silicon wafer 1.

Figure 5:
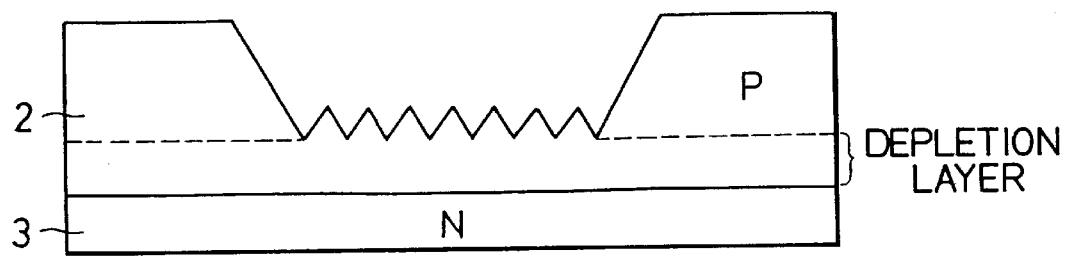
FIG. 5 is a cross-sectional view for use in describing the operation of electrochemical etching.
Figure 6:
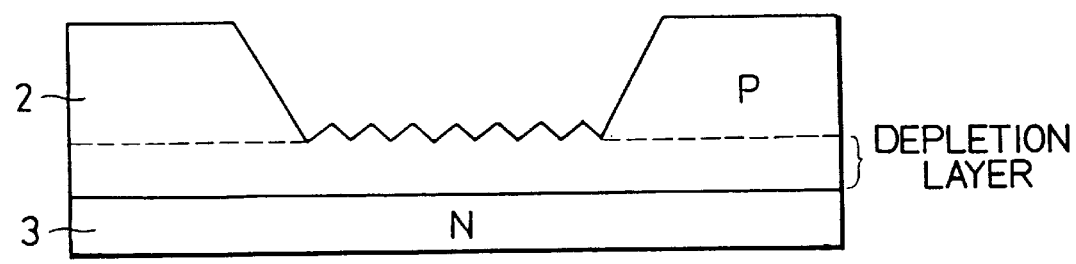
FIG. 6 is a cross-sectional view for use in describing the operation of electrochemical etching.
Figure 7:
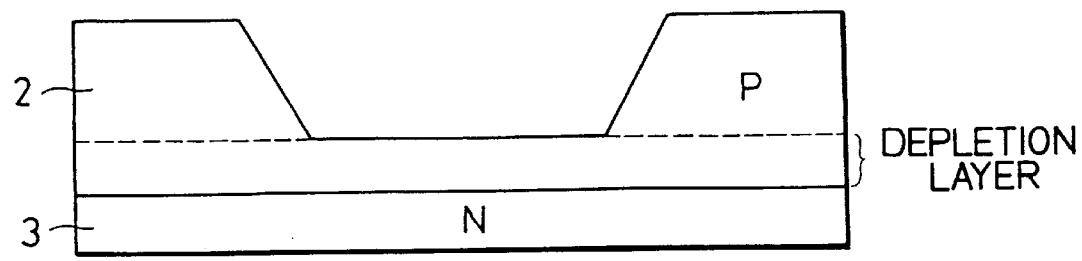
FIG. 7 is a cross-sectional view for use in describing the operation of electrochemical etching.

At the timing t2 within the third period $\hat{3}$, as the anodic oxide film is etched as well, though. the etching speed is low, the etching and production of the anodic oxide film are equilibrated with each other. As illustrated in FIG. 5, the etching surface has concave parts and convex parts at this timing. Furthermore, in this embodiment, voltage is continuously applied to the etching surface within the KOH solution for further 10 minutes from the timing t2 to provide overetching. As a result, as illustrated in FIGS. 6 and 7, the convex parts of the convex parts and concave parts on the etching surface becomes gentle in gradient and accordingly the etching surface of the diaphragm gradually becomes smooth. This change in the etching surface condition has been confirmed through the observation of cross-sectional photos thereof.

The above development in the etching surface is presumably caused by a phenomenon (mechanism) described in this paragraph. Although the etching surface has concave parts and convex parts as illustrated in FIG. 5, the film quality of the anodic oxide film of the convex part is different from the film quality of the anodic oxide film of the concave part so that the etching speed of the anodic oxide film of the convex part is higher than the etching speed of the anodic oxide film of the concave part. For this reason, the etching of the anodic oxide film of the convex part progresses faster than the etching of the anodic oxide film of the concave part, and the etching further progresses and the silicon of the convex part exposed, and thereby the etching is promoted.

Therefore, in FIG. 4. the overetching is provided to the etching surface after the peak of the flowing current value within the second period $\hat{2}$ and from the point of inflection (the timing t2) to equilibrium current due to the anodic oxide film within the third period $\hat{3}$ for the specified time T (10 minutes). The point of time when the specified time T has lapsed is a point of time when the etching has terminated.

Figure 8:
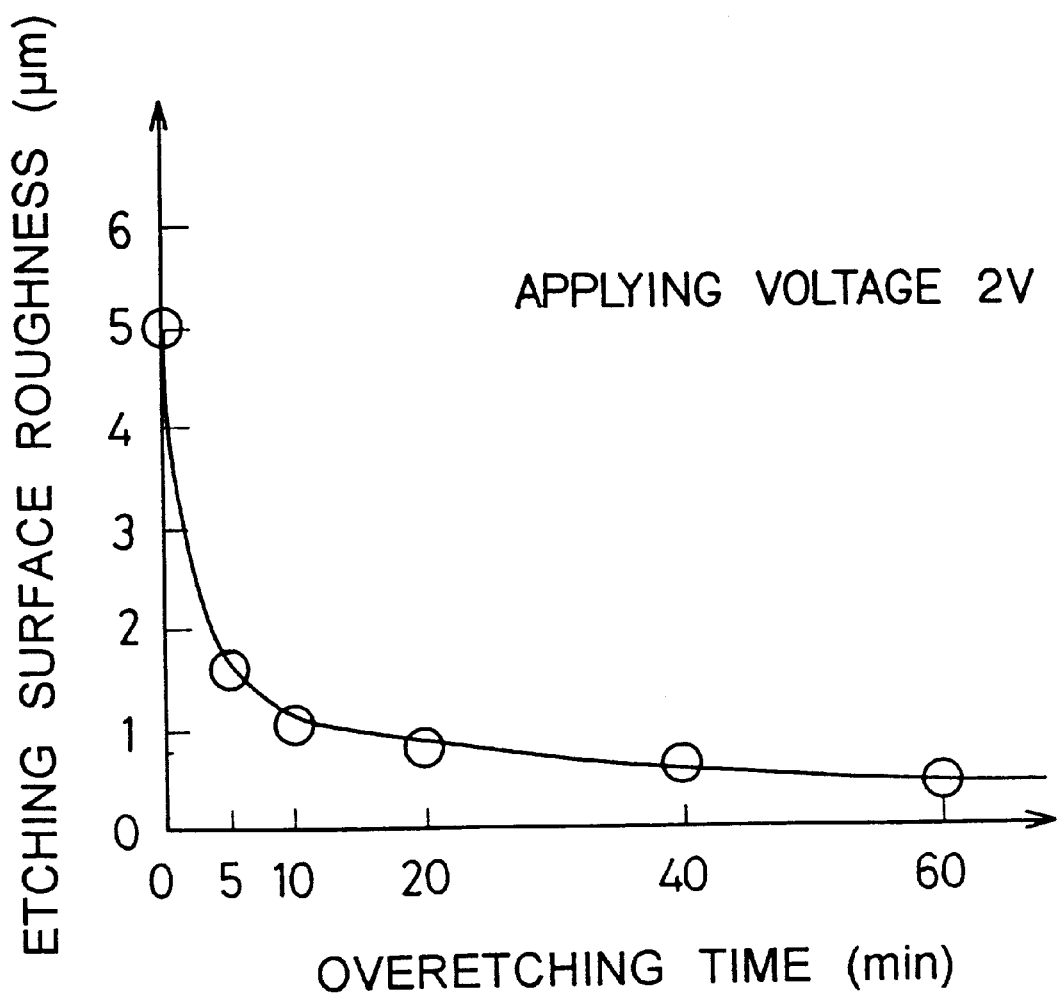
FIG. 8 is a graph showing a relationship between overetching time and etching surface roughness.

FIG. 8 illustrates the relation between the overetching time and the etching surface roughness. If the overetching is not provided, the etching surface has a roughness of 5 $\mu$m. However, if the overetching is performed for 5 minutes or more, the roughness of the etching surface reduces to 2 $\mu$m or less, and if the overetching is performed for 10 minutes or more, the roughness of the etching surface further reduces to 1 $\mu$m or less. The overetching time is set to 10 minutes in this embodiment, the overetching time should be 5 minutes or more and preferably be within a range from 10 minutes to 60 minutes.

On the other hand, in the anisotropic etching by using KOH, the etching surface roughness varies depending on the concentration and temperature of the KOH solution, the concentration of impurities, etc., and therefore the control of these parameters for smoothing the etching surface is difficult. In this embodiment, however, only by properly setting the overetching time, the etching surface can be smoothed to the specified roughness or less. In other words, as the etching surface can be smoothed without being affected by the concentration or temperature of the KOH solution, the concentration of impurities, etc., the KOH solution can easily be controlled, that is, the KOH solution may not necessarily be 33 wt % and 82° C.

Furthermore, the thickness of the diaphragm is determined by the sum of the thickness of the N-type epitaxial layer 3 and the thickness of the depletion layer extending to the side of the P-type silicon substrate 2 as illustrated in FIG. 7. Therefore, when the thickness of the N-type epitaxial layer 3 and the concentration of impurities are fixed, the thickness of the diaphragm can be adjusted by adjusting the applying voltage value.

Incidentally, when the opening area for etching varies, the current values within the first period 1̂ and second period 2̂ in FIG. 4 also vary but the waveform in the relation between the current and the etching time does not vary. For this reason, the etching surface can evenly be smooth throughout the silicon wafer surface by detecting the timing t2, i.e., the point of time when ΔI/Δt turns to be 0, and setting the overetching time accordingly.

In a semiconductor pressure sensor in which the diaphragm has been formed as described above, as the diaphragm surface is smooth, the lineality between the pressure and the sensor output is high. In other words, as the diaphragm thickness is not uniform due to the rough etching surface, the pressure distribution is uneven and the lineality between the pressure and the sensor output is low.

In this embodiment, as described above, in providing electrochemical etching to the (110)-oriented silicon wafer 1 having the PN junction by using the KOH solution, it is so arranged that the etching is started from one surface on which the PN junction is formed, and when the specified time T (10 minutes) lapses from a point of time when the formation of the anodic oxide film is equilibrated with the etching of the anodic oxide film (the timing t2 in FIG. 4) on the etching surface at the PN junction part, voltage application is terminated. In this arrangement, although the etching surface has concave parts and convex parts when the formation of the anodic oxide film is equilibrated with the etching of the anodic oxide film, the etching surface is smoothed by the subsequent voltage application. Therefore, unlike the Journal of NIPPONDENSO Technical Disclosure No. 88-002, the etching surface of the (110)-oriented silicon wafer 1 can easily be smoothed by using electrochemical etching without providing a SP—SiO$_2$ film.

Furthermore, as the point of time when the equilibrium state is obtained is set to the point of inflection to the constant current after the current value peak by detecting the flowing current, the point of time when the equilibrium state is obtained can precisely be detected.

Moreover, as the specified time T (overetching time) is set to 5 minutes or more, the etching surface can exactly be smoothed to a roughness of 2 μm or less.

Now, in the following paragraphs, modifications to this embodiment will be described.

In Step 106 in FIG. 2, it may also be so arranged that the controller 19 judges whether or not the specified time To (FIG. 4) has lapsed and terminates voltage application after the lapse of the specified time To from the peak point of flowing current. Specifically, time Ta which constitutes the point of inflection to the constant current after the flowing current peak is experimentally obtained beforehand, the point of time when the specified time Ta has lapsed after the detection of the peak current is regarded as the point of inflection, and when the specified time To (=Ta +T) has lapsed after the flowing current peak, voltage application is terminated.

In this modification, as there is no need to detect the point of inflection to the constant current after the flowing current peak, the operation processing by the controller 19 can be alleviated. In other words, there is no need to detect the point of inflection to the constant current in Step 203, there is no need to provide the flags F1 and F2, and therefore, the operation processing by the controller 19 can be alleviated.

Second Embodiment

Next, the second embodiment according to the present invention will be described focusing on the differences from the first embodiment.

In this embodiment, pulse voltage is applied as a voltage application method in overetching.

FIGS. 9 and 10 will be used for this description. FIG. 9 is the counterpart of FIG. 4, while FIG. 10 is the counterpart of FIG. 3.

In FIG. 10, when the formation of the anodic oxide film formation is equilibrated with the etching of the anodic oxide film in Step 203, the controller 19 proceeds through Steps 204 and 205 to Step 207. In Step 207, the controller 19 sets the open/close operation mode of the contact 18. In this open/close operation mode, the controller 19 opens/closes the contact 18 as illustrated in FIG. 9. In this open/close operation, both the open time tx and close time ty of the contact 18 are 2.5 seconds respectively and the cycle tz is 5 seconds.

Figure 11A:
FIGS. 11A through 11E are cross-sectional views of the etching surface according to the second embodiment, each illustrating the development in the etching surface.
Figure 11B:
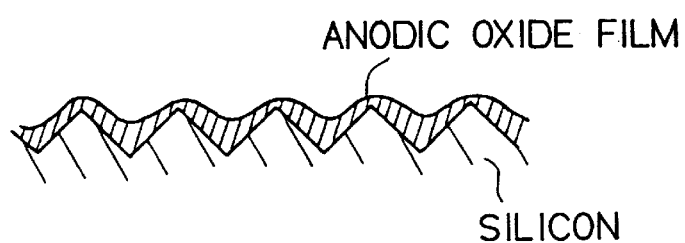
Figure 11C:
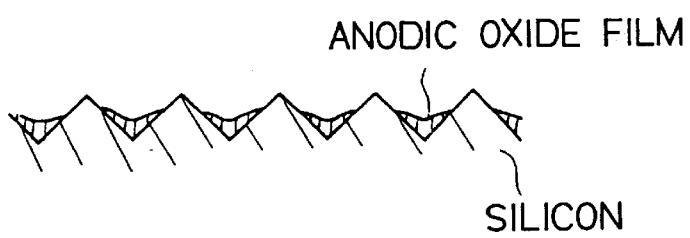
Figure 11D:
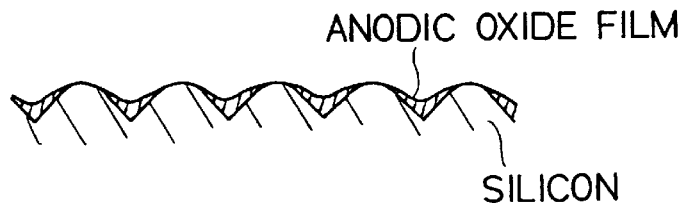

In this embodiment, as illustrated in FIG. 11A, the etching surface has triangular concave parts and convex parts. Then, as illustrated in FIG. 11B, by the time when the formation of the anodic oxide film is equilibrated with the etching of the anodic oxide film, an oxide film has been formed on the concave parts and convex parts of the etching surface. Following this, as illustrated in FIG. 11C, during the open time tx of the contact 18, the anodic oxide film on the convex parts is removed by the KOH solution and thereby the silicon of the convex parts is exposed. Then, as illustrated in FIG. 11D, the exposed silicon of the convex parts is etched. Next, within the close time ty of the contact 18, an anodic oxide film is formed on both the convex parts and concave parts.

Figure 11E:
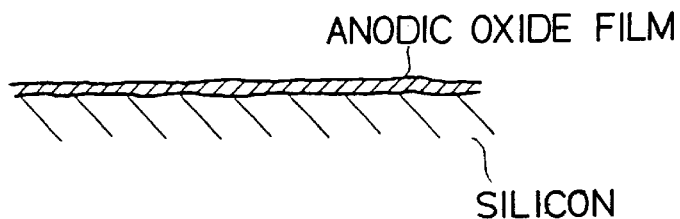

By repeating the above operations, as illustrated in FIG. 11E, a smooth etching surface can be obtained.

As described above, by opening/closing the contact 18 during the overetching, the etching surface can be smoothed faster than the state in which the contact 18 remains in the closed state as in the first embodiment. Accordingly, though the overetching time T is set to 10 minutes in the first embodiment, the overetching time T is now set to 5 minutes in this embodiment.

Now, description will be given to the reason why only the convex parts of the etching surface are selectively etched when pulse wave is used as applying voltage during the overetching as described above. When the time required for removing all the anodic oxide film (thickness: approximately 10 Å) by the KOH solution in the no voltage applied state when the formation of the anodic oxide film is equilibrated with the etching of the anodic oxide film is t, the anodic oxide film on the convex parts of the etching surface can selectively be etched by opening the contact 18 for approximately t/2. In other words, the film quality of the anodic oxide film on the convex parts is different from the film quality of the anodic oxide film on the concave parts, so that the anodic oxide film on the convex parts is etched faster than the anodic oxide film on the concave parts. For this reason, it is assumed that during the open time tx of the contact 18 (when voltage is not applied), the convex parts having the anodic oxide film thereon which is etched faster is selectively etched by the KOH solution.

In this embodiment, as described above, it is so arranged that pulse wave (AC wave) is applied as voltage application during the specified time T starting from the point of time when the formation of the anodic oxide film is equilibrated with the etching of the anodic oxide film (the timing t2 in FIG. 9). Therefore, the smoothing of the etching surface can be promoted, that is, the anodic oxide film on the convex parts of the etching surface is selectively etched and the silicon of the convex parts of the etching surface is removed. As a result, compared with a case where the constant voltage is continuously applied during the overetching as in the first embodiment, the etching surface can be smoothed faster.

Furthermore, as the cycle tz of the pulse wave (AC wave) is set to the time required for the complete removal of the anodic oxide film from the etching surface by the KOH solution, the smoothing of the etching surface can exactly be promoted.

Figure 12:
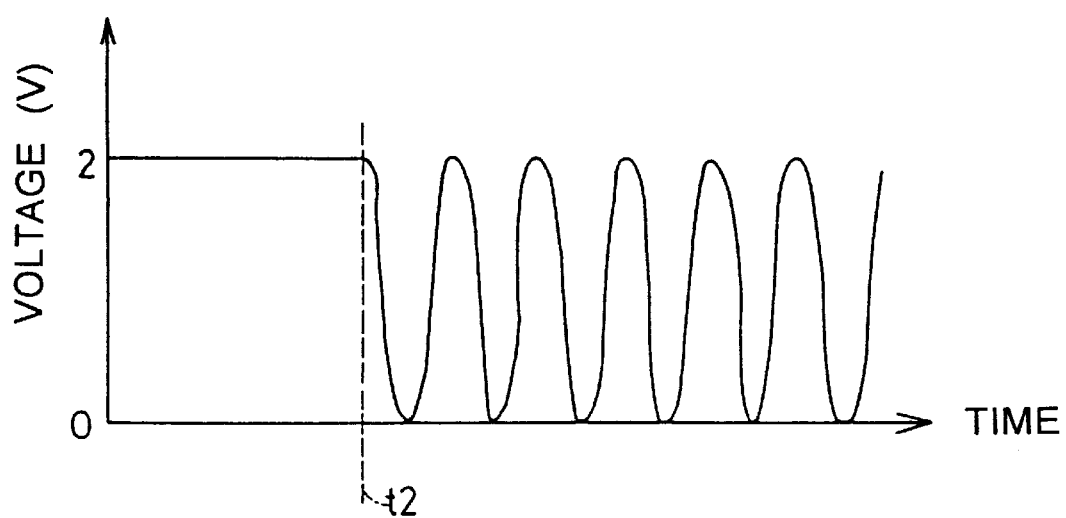
FIG. 12 is a waveform view illustrating the applying voltage in an applied example according to the second embodiment.
Figure 13:
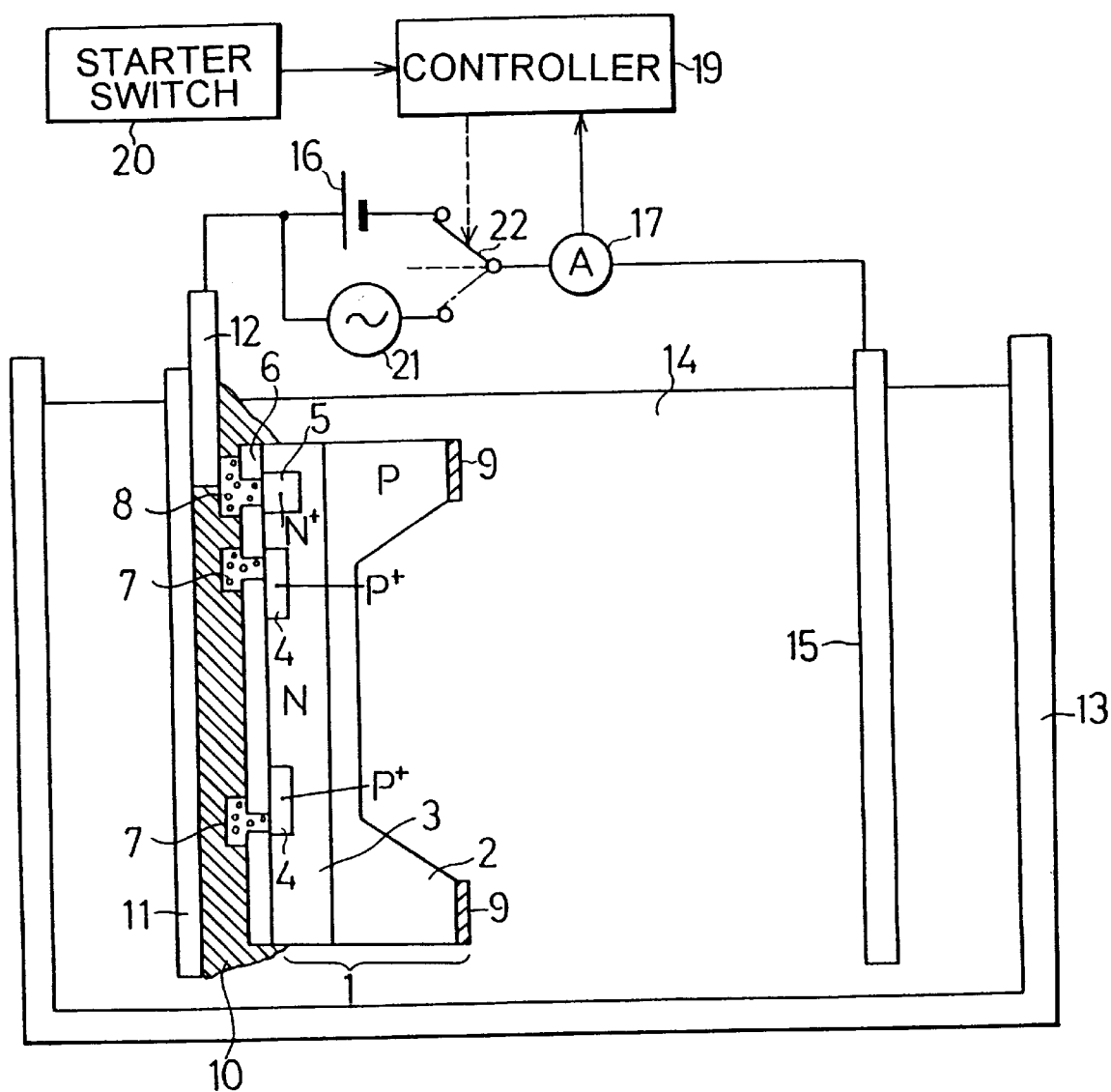
FIG. 13 is a schematic view of an applied example of an electrochemical etching system according to the second embodiment.

FIGS. 12 and 13 illustrate application examples of the second embodiment.

During the overetching after the formation of the anodic oxide film is equilibrated with the etching of the anodic oxide film, sinusoidal wave is applied as illustrated in FIG. 12. To be specific, as illustrated in FIG. 13, the constant voltage power source (2V) 16 and a sinusoidal wave generation source 21 are connected in parallel with each other, the controller 19 switches a selector switch 22 from the constant voltage supplied state to the sinusoidal wave supplied state during the overetching.

As voltage to be applied during the overetching, sawtooth wave or triangular wave may also be used instead of sinusoidal wave.

Furthermore, though the applying voltage in each of the above embodiments is 2V, any voltage may be used if the voltage is equal to or more than 0.7V.

Third Embodiment

Next, an application example of the first embodiment will be described.

This embodiment is an example in which the shapes of edge parts of the diaphragm are improvingly reformed to prevent the weakening thereof due to stress concentration thereon. Like the first embodiment described above, this embodiment is materialized in a form of a semiconductor pressure sensor using a piezo-resistance layer.

Figure 14:
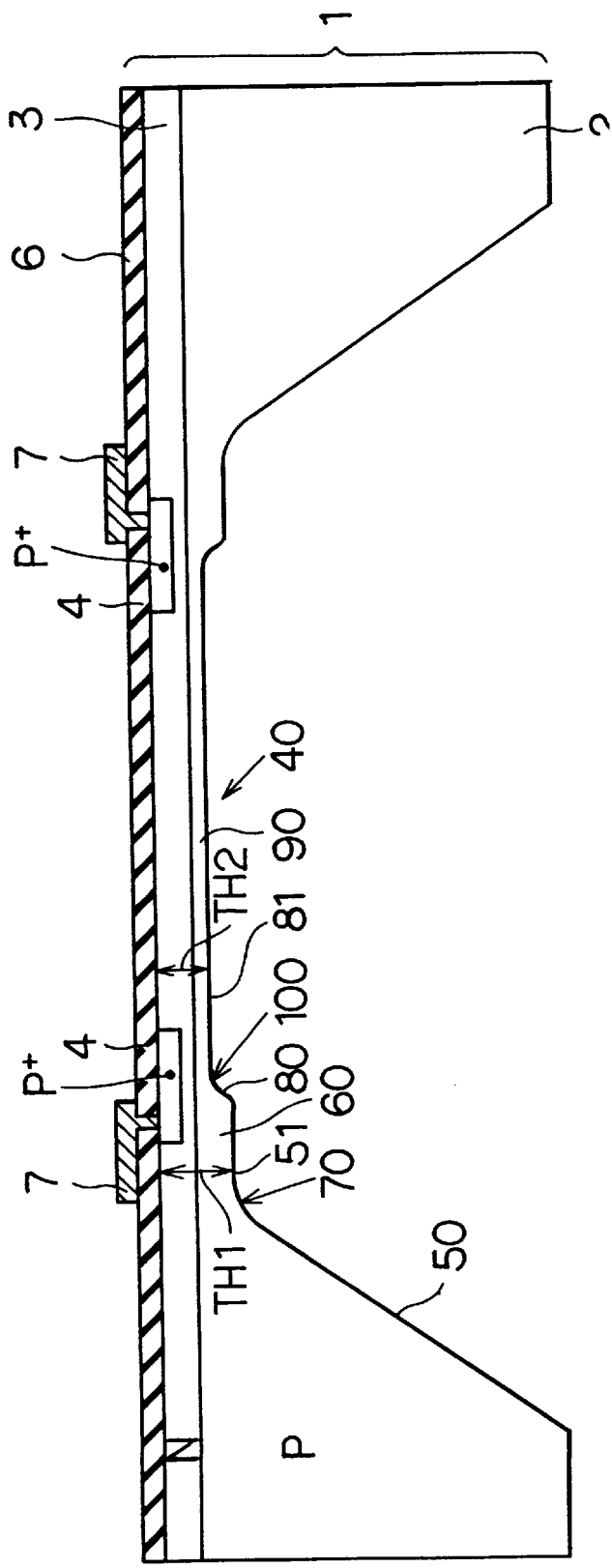
FIG. 14 is a cross-sectional view of an important part of a semiconductor pressure sensor according to a third embodiment of the present invention.
Figure 15:
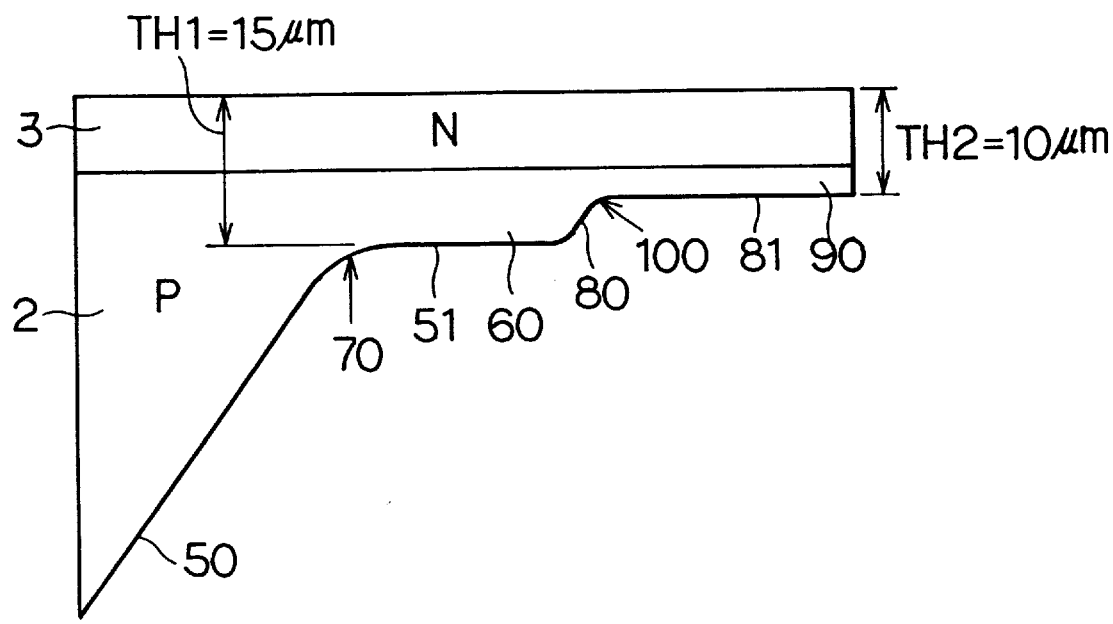
FIG. 15 is an enlarged view of a corner part of the diaphragm.

FIG. 14 is a cross-sectional view of the semiconductor pressure sensor according to this embodiment, and FIG. 15 is an enlarged view of a corner part of the diaphragm of the semiconductor pressure sensor of FIG. 14.

On a surface of the P-type (110)-oriented silicon substrate 2 is formed the N-type epitaxial layer 3 of 10 μm thick, and of this stacked body is composed the silicon wafer 1. On the other surface of the P-type silicon substrate 2 is formed a first concave part 50 which is opened, and of a bottom surface 51 of the concave part 50 is composed of a thin part 60. A corner part 70 of the bottom surface 51 of the first concave part 50 is curved. On the bottom surface part of the first concave part 50 is formed a second concave part 80, and with a bottom surface 81 of the second concave part 80 is composed of a thin part 90. A corner part 100 of the bottom surface 81 of the second concave part 80 is curved. More specifically, as illustrated in FIG. 15, the thickness TH1 of the thin part 60 is within a range of 15–20 μm, and the thickness TH2 of the thin part 90 is within a range of 10–15 μm.

With the thin parts 60 and 90 is formed a diaphragm 40. The outer circumferential part of the diaphragm 40 is, as illustrated in FIG. 15, of two-tier structure. These two concave parts 50 and 80 are formed by electrochemical etching.

In FIG. 14, in the N-type epitaxial layer 3 is formed the $P^+$-type impurity diffusion layer 4. This $P^+$-type impurity diffusion layer 4 serves as a piezo-resistance for sensing strain. On the surface of the N-type epitaxial layer 3 is formed the silicon oxide film 6. The $P^+$-type impurity diffusion layer 4 is electrically drawn to the surface side of the silicon oxide film 6 by the aluminum wiring 7.

Now, the manufacturing method for the semiconductor pressure sensor of such construction will be described.

Figure 21:
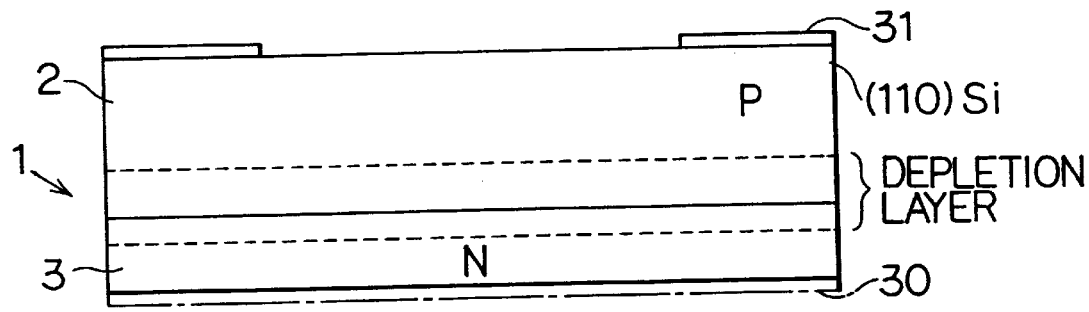
FIG. 21 is a cross-sectional view for use in describing the operation of electrochemical etching.

In the first place, the silicon wafer 1 before etching illustrated in FIG. 21 is made ready. All over the P-type (110)-oriented silicon substrate 2 has been grown the N-type epitaxial layer 3, and all over the N-type epitaxial layer 3 has been grown a metallic film 30 (corresponding to 8 in FIG. 1). Furthermore, on the surface of the P-type (110)-oriented silicon substrate 2 are formed mask material 31 (corresponding to 9 in FIG. 1) on specified areas. As the mask material, a silicon nitride film (SiN) is used.

Figure 16:
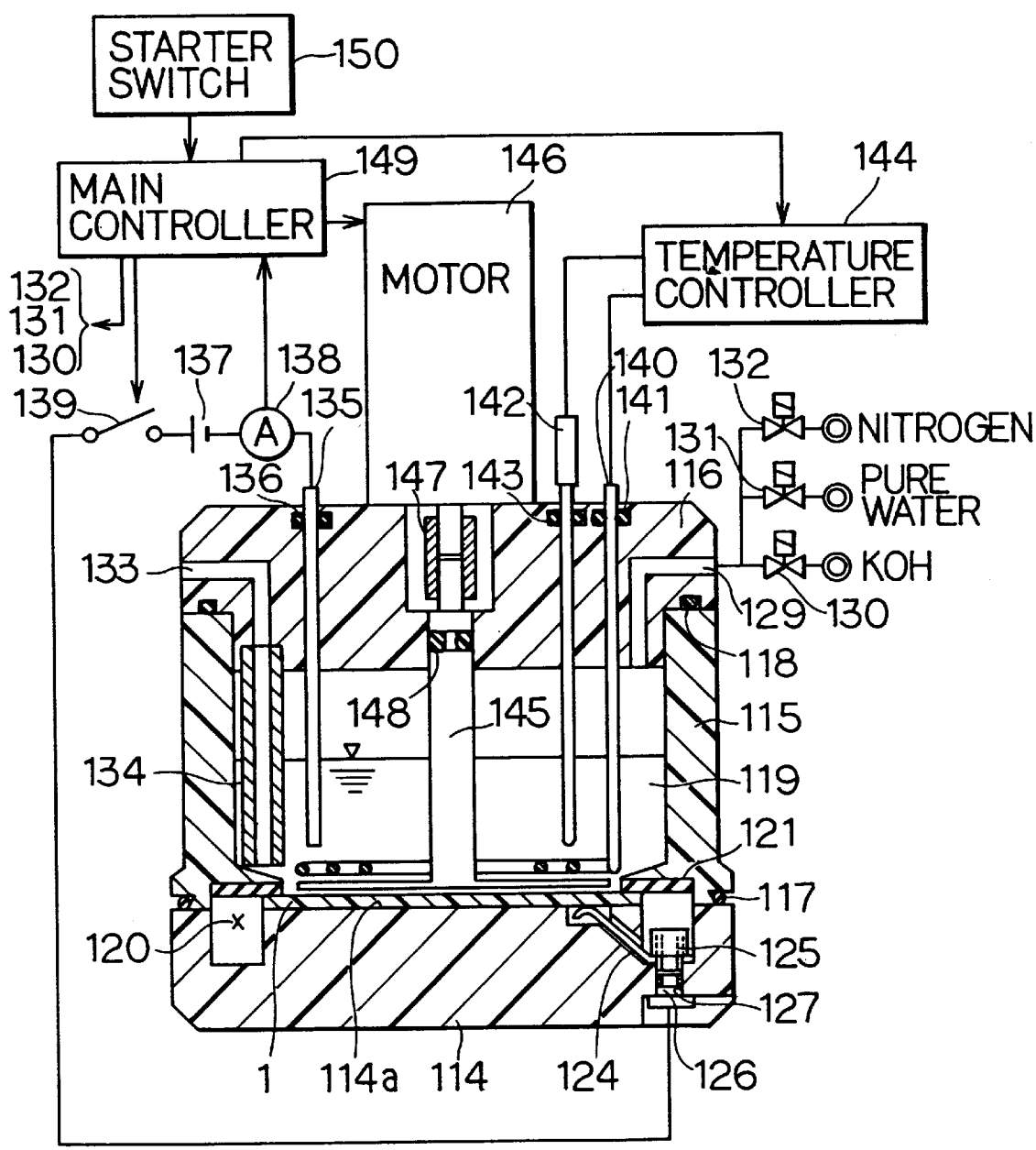
FIG. 16 is a schematic construction view of an electrochemical etching apparatus.

FIG. 16 is a schematic construction view of an electrochemical etching apparatus for use in forming the diaphragms 40 over the silicon wafer 1.

The electrochemical etching apparatus comprises a base 114, a cylindrical frame body 115 and a lid body 116. These elements are made of tetrafluoroethylene resin, for example, and therefor high in dielectric strength, heat resistance and corrosion resistance. The bottom surface open end of the frame body 115 is arranged on the base 114 so as to be liquid-tightly held by an O-ring 117, and the top surface open end of the frame body 115 is arranged on the lid body 116 so as to be liquid-tightly held by an O-ring 118. The base 114, the frame body 115 and the lid body 116 compose a liquid-tight container which can hold 33 wt % KOH solution 119 (corresponding to 14 in FIG. 1), an alkali anisotropic etchant.

A top surface 114a of the base 114 is a flat and smooth substrate mounting surface. On this top surface 114 is arranged the silicon wafer 1 to be etched in such a way that the P-type (110)-oriented silicon substrate 2 of the silicon wafer 1 can face upward with the surface thereof being in contact with the 33 wt % KOH solution 119 and the metallic film 30 (FIG. 21) of the silicon wafer 1 being in contact with the top surface 114a of the base 114.

On the circumferential part of the top surface (substrate mounting surface) 114a of the base 114 is annularly provided a negative pressure chamber forming concave part 120. On the bottom surface of the frame body 115 is fixed a ringed packing 121. This ringed packing 121 closes the open part of the negative pressure chamber forming concave part 120 while enclosing the outer circumferential end of the silicon wafer 1. In this arrangement, when the inside of the negative pressure chamber forming concave part 120 is evacuated by a vacuum pump or the like (not illustrated), the packing 121 is sucked and the silicon wafer 1 is immovably fixed. In this way, the application of masking to the etching -surface at the outer circumferential edge of the silicon wafer 1 is achieved by the packing 121. Furthermore, by this evacuation, both the base 114 and the frame body 115 are sucked and fixed.

Figure 17:
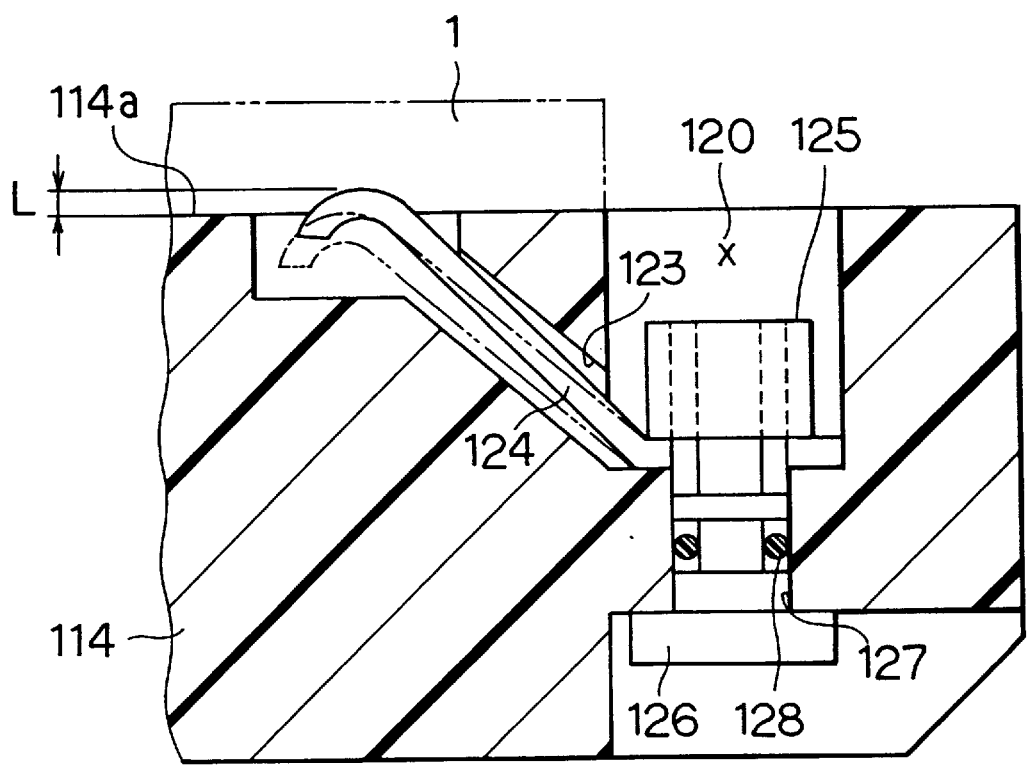
FIG. 17 is a partly enlarged view of the electrochemical etching apparatus.

As illustrated in FIG. 17, a passage 123 is formed in the base 114 to communicate the top surface (substrate mounting surface) 114a and the negative pressure forming concave part 120 with each other. In this passage is disposed an anodic electrode 124 (corresponding to 12 in FIG. 1). In the negative pressure forming concave part 120, an end of the anodic electrode 124 is connected to a pin 126 by a nut 125. The pin 126 is exposed to an outer part of the base 114 through a communication hole 127, and air-tightly held by an O-ring 128. The other end of the anodic electrode 124 is positioned above the top surface 114*a* of the base 114 by a distance of L when the silicon wafer 1 is not yet mounted. When the silicon wafer 1 is mounted on the top surface 114*a* of the base 114, however, the other end of the anodic electrode 124 is deflected to a position indicated by a chain line with two dots in FIG. 17. In this way, voltage can be applied to the silicon wafer 1 with the anodic electrode 124 being in contact with the metallic film 30 (FIG. 21) of the silicon wafer 1 at a certain contact pressure.

In FIG. 16, a supply passage 129 reaching the frame body 115 is formed in the lid body 116 to supply 33 wt % KOH solution through a valve 130, pure water through a valve 131 and nitrogen gas through a valve 132. On the other hand, a drain passage 133 communicating the inside and the outside with each other is formed also in the lid body 116. An end of this drain passage 133 is open to the bottom part inside the frame body 115 through a pipe 134. It-is through the pipe 134 and the drain passage 133 that the 33 wt % KOH solution 119 and the pure water within the frame body 115 can be drained.

A bar-shaped cathodic electrode 135 (corresponding to 15 in FIG. 1) is disposed in penetration through the lid body 116, and air-tightly held by an O-ring 136. This cathodic electrode 135 extends into the 33 wt % KOH solution 119 within the frame body 115 to a certain depth. Between the cathodic electrode 135 and the anode electrode 124 are connected in series a DC power source (1–10V) 137 (corresponding to 16 in FIG. 1), an ammeter 138 (corresponding to 17 in FIG. 1) and a contact 139 (corresponding to 18 in FIG. 1). By closing the circuit with the contact 139, potential difference is applied to the cathodic electrode 135 and the anodic electrode 124 from the DC power source (1–10V) 137. At this time, the current flowing from the silicon wafer 1 to the cathodic electrode 135 is detected by the ammeter 138.

A heater 140 is disposed in penetration through the lid body 116, and the air-tightness therebetween is maintained by an O-ring 141. When the heater 140 is electrically energized, the heater 140 generates heat and thereby the temperature of the 33 wt % KOH solution 119 can be raised. A temperature sensor 142 is disposed in penetration through the lid body 116, and air-tightness is maintained by an O-ring 143. This temperature sensor 142 detects the temperature of the 33 wt % KOH solution 119. While monitoring the temperature of the 33 wt % KOH solution 119 detected by the temperature sensor 142, a temperature controller 144 maintains the temperature of the 33 wt % KOH solution 119 at 110° C. by electrically energizing and controlling the heater 140.

Within the frame body 115 is disposed stirring blades 145. The stirring blades 145 are rotated by a motor 146 mounted on the lid body 116 through a coupling 147, and thereby the 33 wt % KOH solution 119 is stirred. The air-tightness between the stirring blades 145 and the lid body 116 is maintained by an O-ring 148.

A main controller 149 (corresponding to 19 in FIG. 1) detects the start of the etching based on the signal from a starter switch 150 (corresponding to 20 in FIG. 1), and at the same time, detects the flowing current based on the signal from the ammeter 138. Furthermore, the main controller 149 drives and controls the contact 139, the motor 146, the temperature controller 144 and the valves 130 through 132. The main controller 149 is composed mainly a microcomputer.

In the etching procedures, as illustrated in FIG. 16, the silicon wafer 1 is disposed on the top surface 114*a* of the base 114, the inside of the negative pressure chamber forming concave part 120 is evacuated, and the silicon wafer 1 is fixed by the packing 121.

Figure 19:
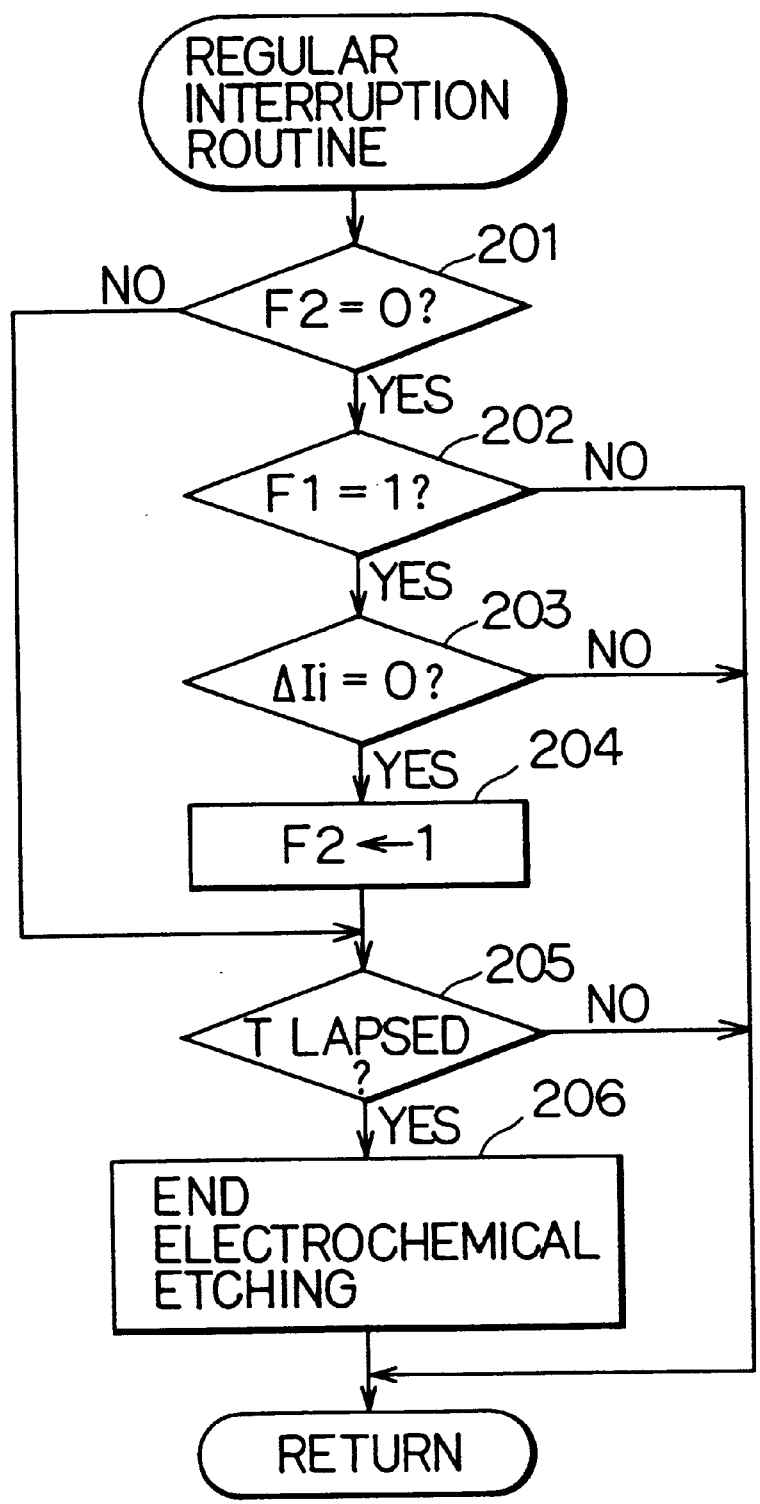
FIG. 19 is a flow chart for use in describing the operation of electrochemical etching.

Then, the main controller 149 executes a processing illustrated in FIGS. 18 and 19, which are corresponding to the processing illustrated in FIGS. 2 and 3. Now, this processing will be described referring to a time chart illustrated in FIG. 20. Here, FIG. 20 is corresponding to FIG. 4, and the flowing current value and the opened/closed state of the contact 139 are taken as ordinate axis.

In the first place, when the main controller 149 receives an etching start signal from the starter switch 150, the main controller 149 starts the processing illustrated in FIG. 18. The main controller 149 opens the valve 130 and admits a specified quantity of the 33 wt % KOH solution 119 into the liquid-tight container. Then, the main controller 149 stirs the 33 wt % KOH solution 119 with the stirring blades 145, and on the other hand, maintain the temperature of the 33 wt % KOH solution 119 at 110° C. through the temperature controller 144 that controls the heater 140 in the live state. From this state, the main controller 149 closes the contact 139 in Step 101, and sets flags F1 and F2 to "0" in Step 102. Then, the main controller 149 reads a present current value $I_i$ measured by the ammeter 138 in Step 103, and calculates the difference between the present current value $I_i$ and the previous current value $I_{i-1}$, $\Delta I_i$ ($=I_i-I_i$), in step 104.

Figure 20:
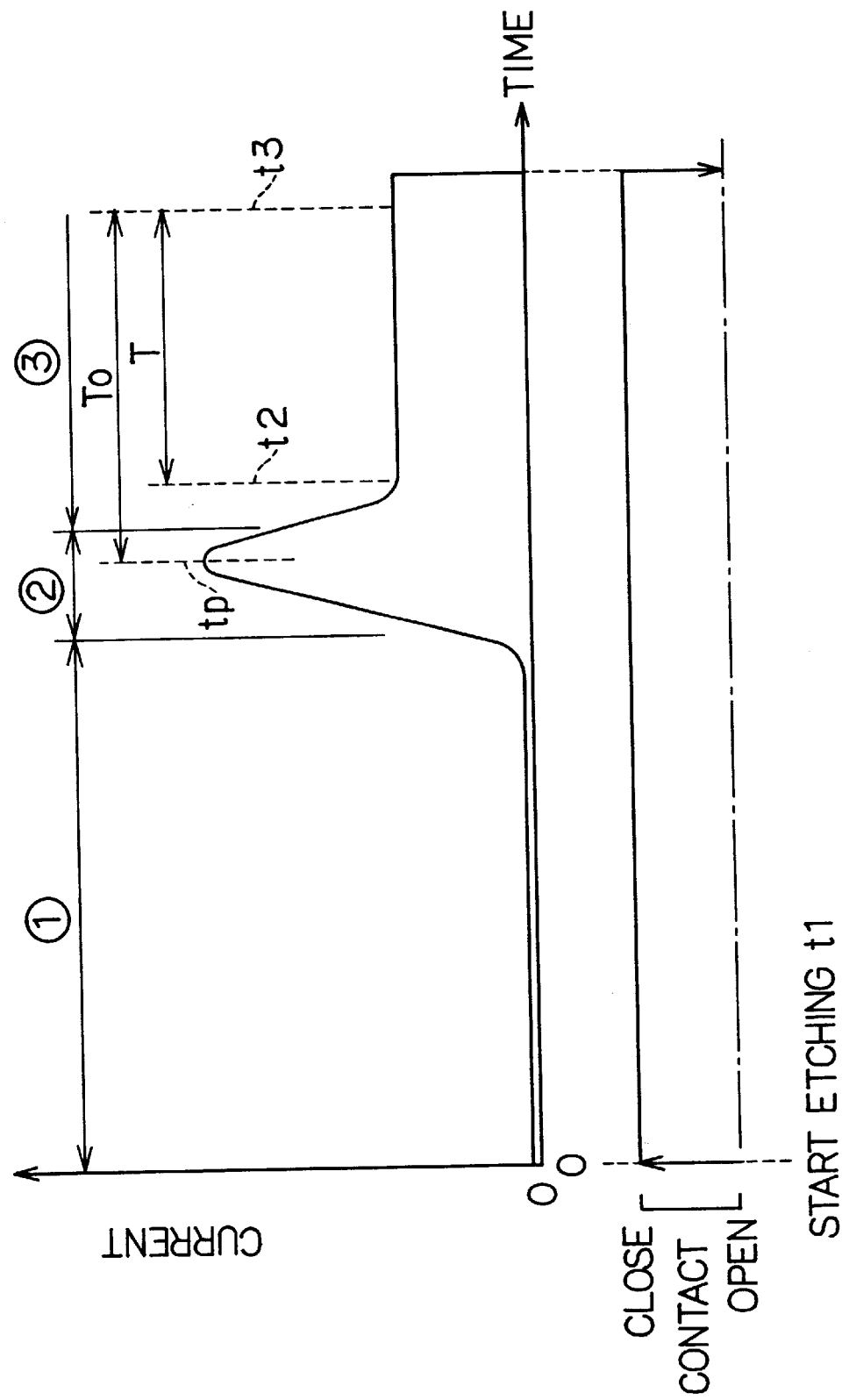
FIG. 20 is a time chart for use in describing the operation of electrochemical etching.

In Step 105, the main controller 149 judges whether or not the variation $\Delta I_i$ in the flowing current has reversed from positive to negative, that is, whether or not the flowing current value has reached the peak (the timing tp in FIG. 20). When the main controller 149 judges that the variation $\Delta I_i$ in the flowing current has not reversed from positive to negative, the main controller 149 returns to Step 103. When the main controller 149 judges the variation $\Delta I_i$ has reversed from positive to negative, the main controller 149 sets the flag F1 to "1" in Step 106.

On the other hand, the main controller 149 executes the regular interruption routine illustrated in FIG. 19 every specified time. The main controller 149 judges whether or not the flag F2 is "0" in Step 201. However, as the flag F2 is initially 0, the main controller 149 proceeds to Step 202. Then, the main controller 149 judges whether or not the flag F1 is "1" in Step 202. However, as the flag F1 is initially 0, the main controller 149 returns to the processing of FIG. 18.

When the flowing current value has reached the peak (the timing tp in FIG. 20) and F1 is now equal to 1, the main controller 149 proceeds from Step 202 to Step 203. In Step 203, the main controller 149 judges whether or not the variation $\Delta I_i$ in the flowing current has turned to be "0." As $\Delta I_i$ is negative within a period from the timing tp to the timing t2 and $\Delta I_i$ is not equal to 0, the main controller 149 returns to the processing of FIG. 18.

Subsequently, when the variation $\Delta I_i$ in the flowing current has turned to "0" (the timing t2 in FIG. 20), the main controller 149 sets the flag F2 to "1" in Step 204. Furthermore, the main controller 149 starts the timer in Step 205, and judges whether or not the specified time T (minutes to tens of minutes in this embodiment) has lapsed since the time when the variation $\Delta I_i$ in the flowing current has turned to be "0." As the main controller-149 judges that the time set by the timer has not lapsed the specified time T, the main controller 149 returns to the processing of FIG. 18. In the next and subsequent steps, however, as F2 is equal to 1, the main controller 149 jumps to from the Step 201 to Step 205.

In Step 205, when the specified time T has lapsed (the timing t3 in FIG. 20), the main controller 149 proceeds to Step 206' and terminates the electrochemical etching operation. More specifically, when the specified time T has lapsed, the main controller 149 drains the 33 wt % KOH solution 119, opens the valve 131, and cleans the inside of the liquid-tight container with the pure water. After the completion of the cleaning (confirmed by time management or current monitoring), the main controller 149 closes the valve 131, stops the stirring blades 145, and opens the contact 139 and terminates electric energizing. Then, the main controller 149 opens the valve 132 and supplies the nitrogen gas into the liquid-tight container, and thereby discharges the pure water and dry the inside.

Next, the main controller 149 releases the negative pressure from the inside of the negative pressure chamber forming concave part 120, separates the based 114 and the frame body 115 from each other, and takes out the silicon wafer 1.

The behavior of the flowing current will now be described in detail referring to FIG. 20.

The electrochemical etching is started from the state illustrated in FIG. 21. Within the first period $\hat{1}$ immediately after the start of the current flow illustrated in FIG. 20, the etching of the P-type silicon substrate 2 progresses by the chemical reaction between the KOH and the silicon. This is for the reason that while voltage is applied to the silicon wafer 1, current is not supplied to the silicon wafer 1 due to the PN junction formed by the P-type silicon substrate 2 and the N-type epitaxial layer 3.

Within the following second period $\hat{2}$ ( illustrated in FIG. 20, the flowing current has the peak thereof. Within the same period $\hat{2}$, the anodic oxidation progresses due to the electrochemical reaction of the P-type silicon substrate 2 and thereby the formation of the concave part 80 progresses. At this time, the (110)-oriented surface of the P-type silicon substrate 2 is etched, and the sides of the etched part of the P-type silicon substrate 2 becomes (100)-oriented surfaces. This is for the reason that when the PN depletion layer (i.e., the depletion layer extending to the P-type silicon substrate 2 from a PN junction between the P-type silicon substrate 2 and N-type epitaxial layer 3) contacts the 33 wt % KOH solution 119, and thereby current flows and the silicon is oxidized. Here, the peak is gentle within the second period $\hat{2}$ due to the surface distribution of the thickness (unevenness in the thickness) of the silicon wafer 1.

Figure 22:
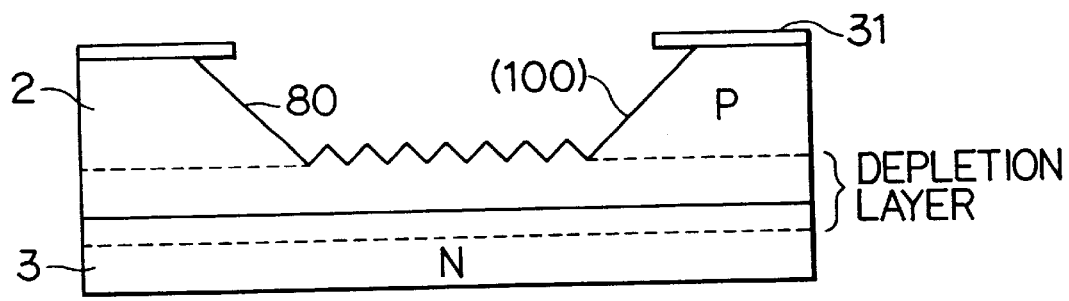
FIG. 22 is a cross-sectional view for use in describing the operation of electrochemical etching.
Figure 23:
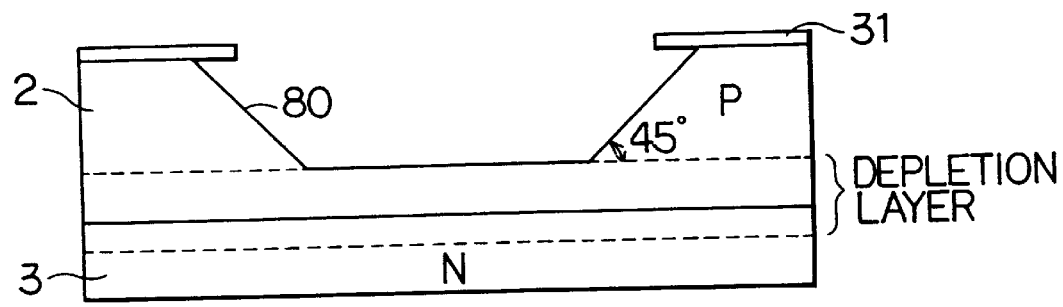
FIG. 23 is a cross-sectional view for use in describing the operation of electrochemical etching.

At the timing t2 within the third period $\hat{3}$ illustrated in FIG. 20, as the anodic oxide film is etched as well, though the etching speed is low, the etching of the anodic oxide film and production of the anodic oxide film are equilibrated with each other. As illustrated in FIG. 22, the etching surface (the bottom surface of the concave part 80) has concave parts and convex parts at this timing. Furthermore, voltage is continuously applied to the etching surface within the 33 wt % KOH solution 119 from the timing t2. As a result, as illustrated in FIG. 23, the convex parts of the concave parts and convex parts formed on the etching surface (the bottom surface of the concave part 80) become gentle in gradient, and accordingly the etching surface of the diaphragm gradually becomes smooth.

Figure 24:
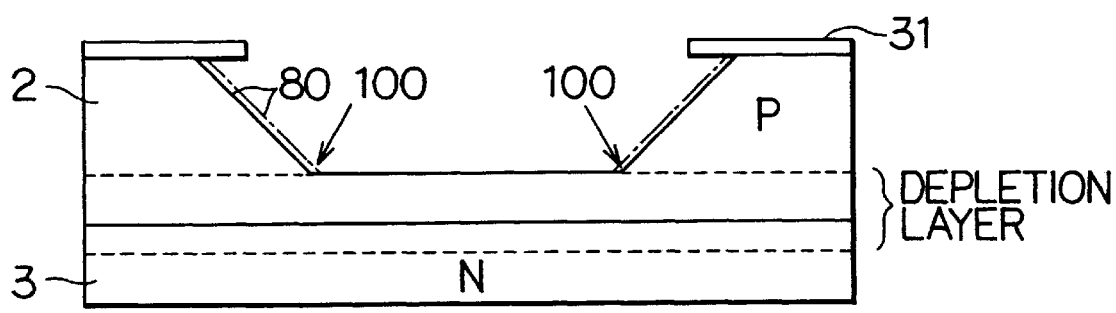
FIG. 24 is a cross-sectional view for use in describing the operation of electrochemical etching.

By further application of voltage within the 33 wt % KOH solution 119, as illustrated in FIG. 24, the sides of the concave part 80 are electrochemically etched, and the corner parts 100 of the bottom surface of the concave part 80 becomes curved.

Figure 25:
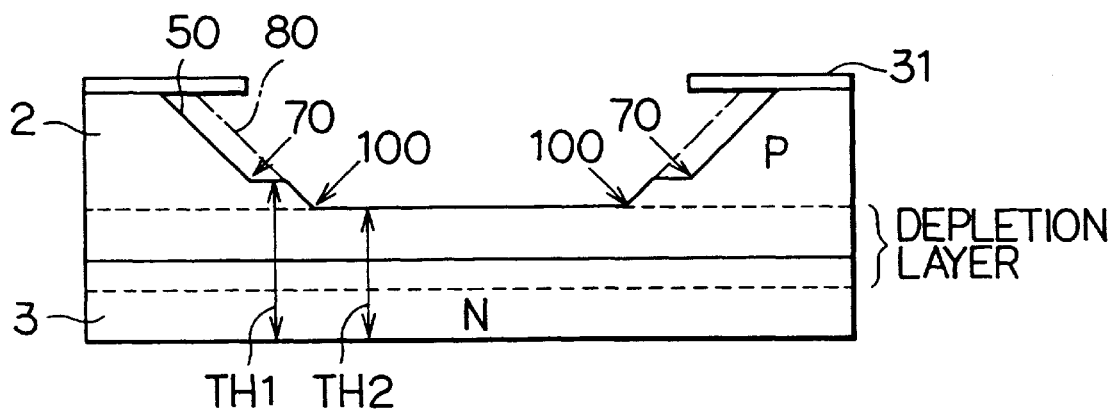
FIG. 25 is a cross-sectional view for use in describing the operation of electrochemical etching.

Then, by further application of voltage within the 33 wt % KOH solution 119, as illustrated in FIG. 25, the sides (tapered surfaces) of the concave part 80 are electrochemically etched. More specifically, the electrochemical etching selectively progresses according to the etching rate on the (100)-oriented surface within the 33 wt % KOH solution 119. As a result, the concave parts 50 are formed on the side wall parts of the concave part 80 of the P-type silicon substrate 2. In the concave part 50, the thickness TH1 of the thin wall part from the bottom surface thereof is larger than the thickness TH2 of the thin wall part from the bottom surface of the concave part 80, and the corner parts 70 of the bottom surface of the concave part 50 are curved.

The above development of the corner part 100 of the bottom surface of the concave part 80 into the curved shape and the formation of the concave parts 50 are presumably caused by a mechanism described in the following paragraph.

Figure 26A:
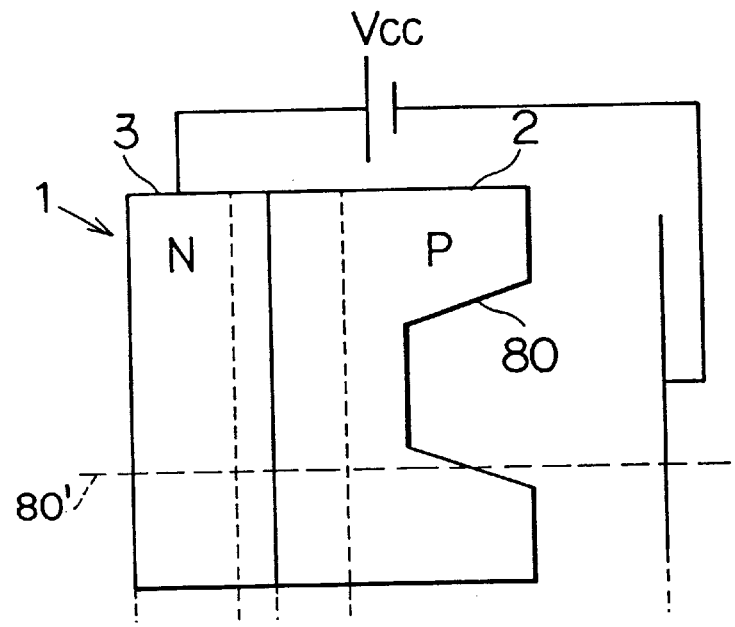
FIGS. 26A and 26B are a cross-sectional view and a voltage distribution chart respectively for use in describing the operation of electrochemical etching.
Figure 26B:
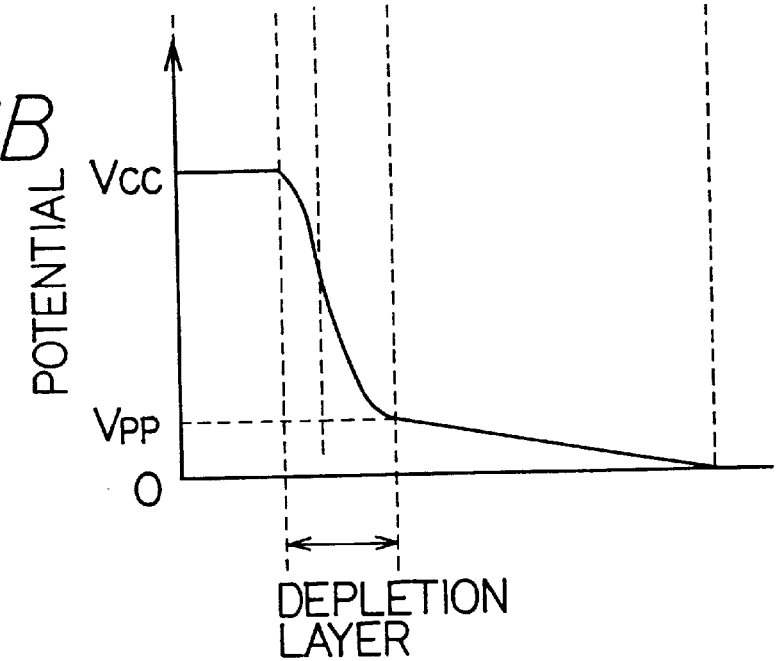
Figure 27A:
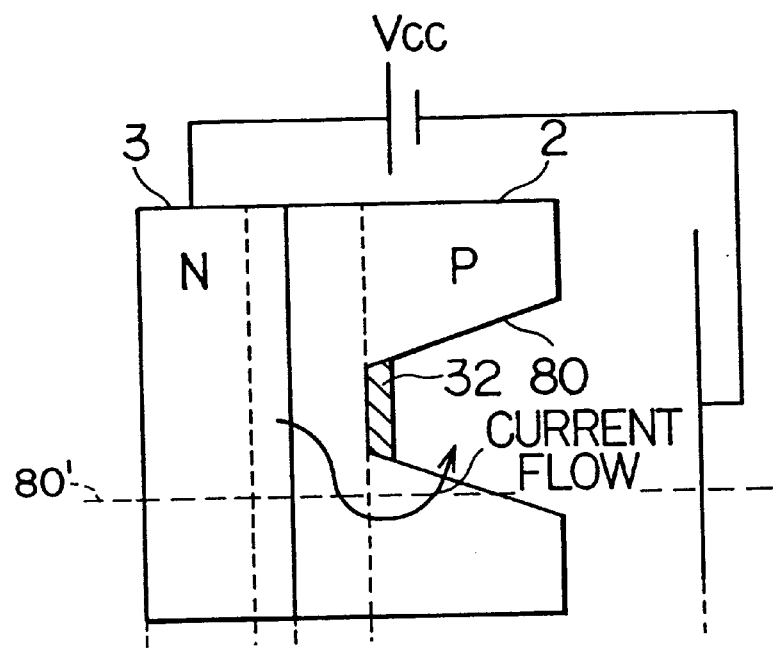
FIGS. 27A and 27B are a cross-sectional view and a voltage distribution chart respectively for use in describing the operation of electrochemical etching.
Figure 27B:
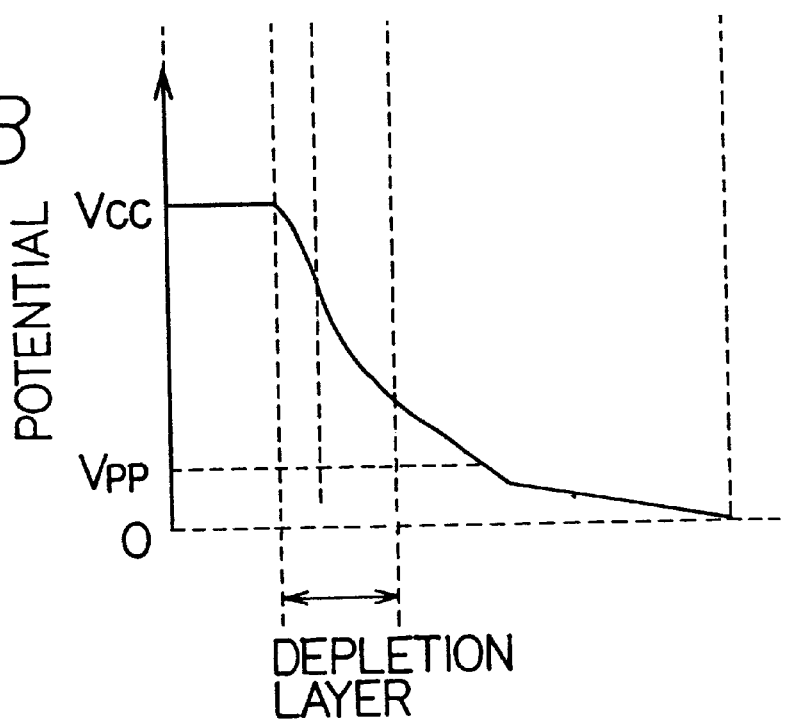
Figure 28A:
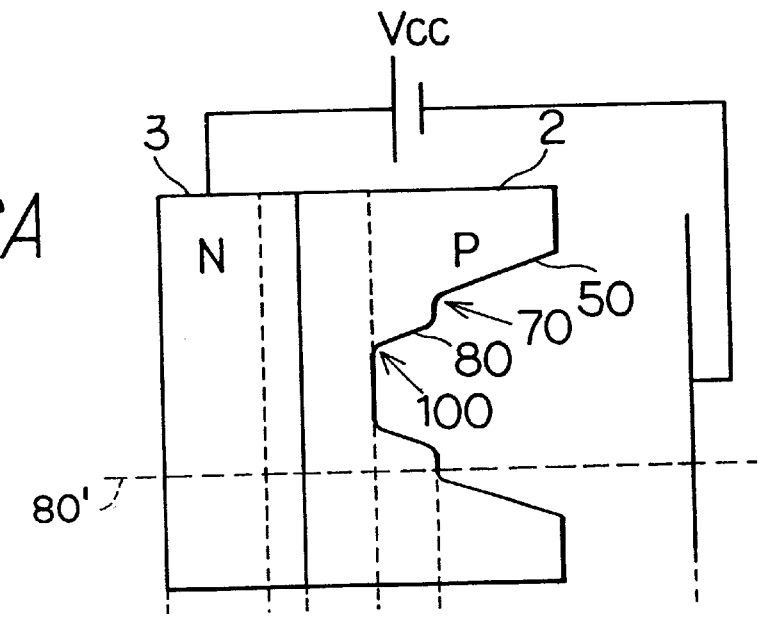
FIGS. 28A and 28B are a cross-sectional view and a voltage distribution chart respectively for use in describing the operation of electrochemical etching.
Figure 28B:
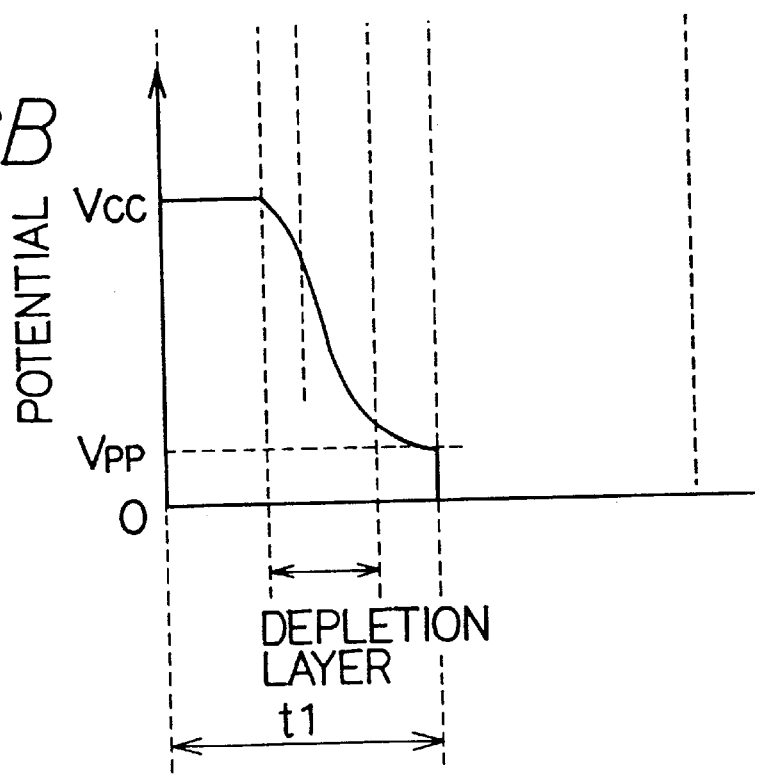

FIG. 26A is a cross-sectional view of the silicon wafer 1, and FIG. 26B illustrates the voltage distribution on a cross sectionat line 80'. These FIGS. 26A and 26B illustrates the ongoing formation (etching) of the concave part 80. The principle of the electrochemical stop etching is based on the fact that when the electric potential of the silicon becomes equal to or above the passivation voltage Vpp (e.g., 0.6V), the oxide film is formed due to the anodic oxidation reaction and therefore the etching of the silicon comes to stop. That is, the position in which the etching comes to stop is a position in which the electric potential of the silicon becomes equal to or above the passivation voltage Vpp. As the voltage Vcc equal to or above the passivation voltage Vpp is applied to the N-type epitaxial layer 3, a depletion layer is generated at the PN junction. As the tip end of the depletion layer on the side of the P-type silicon substrate 2 is approximately equal to the passivation voltage Vpp, the etching comes to stop at the tip end of the depletion layer on the side of the P-type silicon substrate 2. Then, as illustrated in FIGS. 27A and 27B, an anodic oxidation film 32 is formed on the etching surface. As the anodic oxidation film 32 is an insulating film, the current flows to the side surfaces (taper parts) of the concave part 80 formed by the etching, i.e., to positions in which the electric potential is lower than the passivation voltage Vpp. When the voltage application is further continued in this state, the electrochemical etching of the areas in which the electric potential is lower than the passivation voltage Vpp progresses. Then, as illustrated in FIGS. 28A and 28B, the corner parts 100 of the bottom surface of the concave part 80 become curved according to the distribution of the passivation voltage Vpp, and at the same time the concave part 50 is formed and level-difference parts (two-tier structure) are formed. As a result, the corner parts 70 of the bottom surface of the concave part 50 become curved according to the distribution of the passivation voltage Vpp.

In this embodiment, as described above, the electrochemical etching is started from one surface of the silicon wafer 1 having a PN junction part by using the 33 wt % KOH solution 119 (alkali anisotropic etchant), and thereby the concave part 80 is formed on a part of the silicon wafer 1 with the PN junction part as the bottom surface. Then, the electrochemical etching is further continued by using the 33 wt % KOH solution 119, and thereby the corner parts 100 of the bottom surface of the concave part 80 is curved. Furthermore, the electrochemical etching is further continued by using the 33 wt % KOH solution 119, and thereby the concave part 50 with the corner parts 70 of the bottom surface 51 is formed on the side wall parts of the concave part 80. In the sensor thus formed, as both the concave parts 50 and 80 are curved at the corner parts 70 and 100 of the bottom surface, the strength is high, and further the strength is further improved by the two-tier structure with dull corner parts compared with a single-tier structure with no concave part 50. As a result, as the edge parts of the diaphragm are no longer sharp, the withstand pressure of the diaphragm can be improved.

In addition, as this embodiment uses the etching apparatus illustrated in FIG. 16, the diaphragm can be formed in a short time. That is, as the etching apparatus is a sealed-container type, even if the 33 wt % KOH solution of 110° C. is used, there is no splash of the solution due to boiling. Therefore, the etching rate can be three times as high as the etching rate with the 33 wt % KOH solution of 82° C., and thereby the throughput can be improved.

The present invention is not limited to each of the above embodiments. For example, the diaphragm may be of two-tier structure with difference in thickness by changing the application voltage of the electrochemical etching (application voltage in a period from t1 to t2 in FIG. 20) and the application voltage of the subsequent electrochemical etching (application voltage in a period from t2 to t3 in FIG. 20) from each other. In this case, if the application voltage in a period from t2 in FIG. 20 is higher, the two-tier structure of the diaphragm has a larger level difference. On the other hand, if the application voltage in a period from t2 in FIG. 20 is lower, the two-tier structure of the diaphragm has a smaller level difference. This is for the reason that the distribution of the passivation voltage Vpp varies according to the application voltage.

Furthermore, although the (110)-oriented silicon substrate is used in the third embodiment, level difference can be formed by using the (100)-oriented silicon substrate as well.

Moreover, it may be so arranged that the bottom surface of the concave part 80 is smoothed with the corner parts 100 thereof curved and concurrently the concave part 50 is formed by immersing the silicon wafer 1 in the etchant without applying voltage and forming the concave part 80 by using the time management (achieving the state illustrated in FIG. 22), and then applying voltage to the silicon wafer 1 within the etchant.

In addition, in the above embodiment, the voltage application is terminated when the specified time T has lapsed since the flowing current valve $I_i$ exceeded the peak and $\Delta I_i = 0$ was established (the timing t2 in FIG. 20). However, the voltage application may be terminated when the specified time To has lapsed since the peak time of the flowing current (the timing tp in FIG. 20) as discussed in the first embodiment.

Fourth Embodiment

Now, description will be given to the fourth embodiment according to the present invention. This embodiment is an application of the third embodiment. Specifically, the mask element pattern for use in the etching is designated for the formation of the diaphragm, and the diaphragm is shaped square composed of sides extending in an axial orientation of <100> and sides extending in an axial orientation of <110> aiming at the improvement of break strength. Referring to the relevant drawings, the fourth embodiment will now be described.

A semiconductor sensor as the fourth embodiment is a pressure sensor. As illustrated in FIGS. 29A through 29D, this sensor has a monocrystalline semiconductor (silicon) substrate. A concave part 210 opened upwardly in the central part of a main surface 201 is formed.

The concave part 210 is composed of a central rectangular bottom surface 202, four slanting surfaces 203 and 204 contacting the four circumferential sides of the bottom surface 202, and level difference parts 205 formed along sides 224 at which the bottom surface 202 and the slanting surfaces 204 meet each other. The slanting surfaces 203 and the slanting surfaces 204 contact each other in four different directions and form corner parts 243 with small angles of intersection, and at the same time, opened to the main surface 201 with an octagonal opening circumferential edges 211.

Between the bottom surface 202 of the concave part 210 and a back surface 206 of the silicon substrate is formed a thin part 221. This thin part 221 functions as the diaphragm of the pressure sensor. At the pair of sides 224 of the bottom surface 202 are formed the level difference part 205, and the bottom surface 202 is in contact with the slanting surfaces 204 through the level difference parts 205 at an angle of intersection of approximately 45°.

Figure 30A:
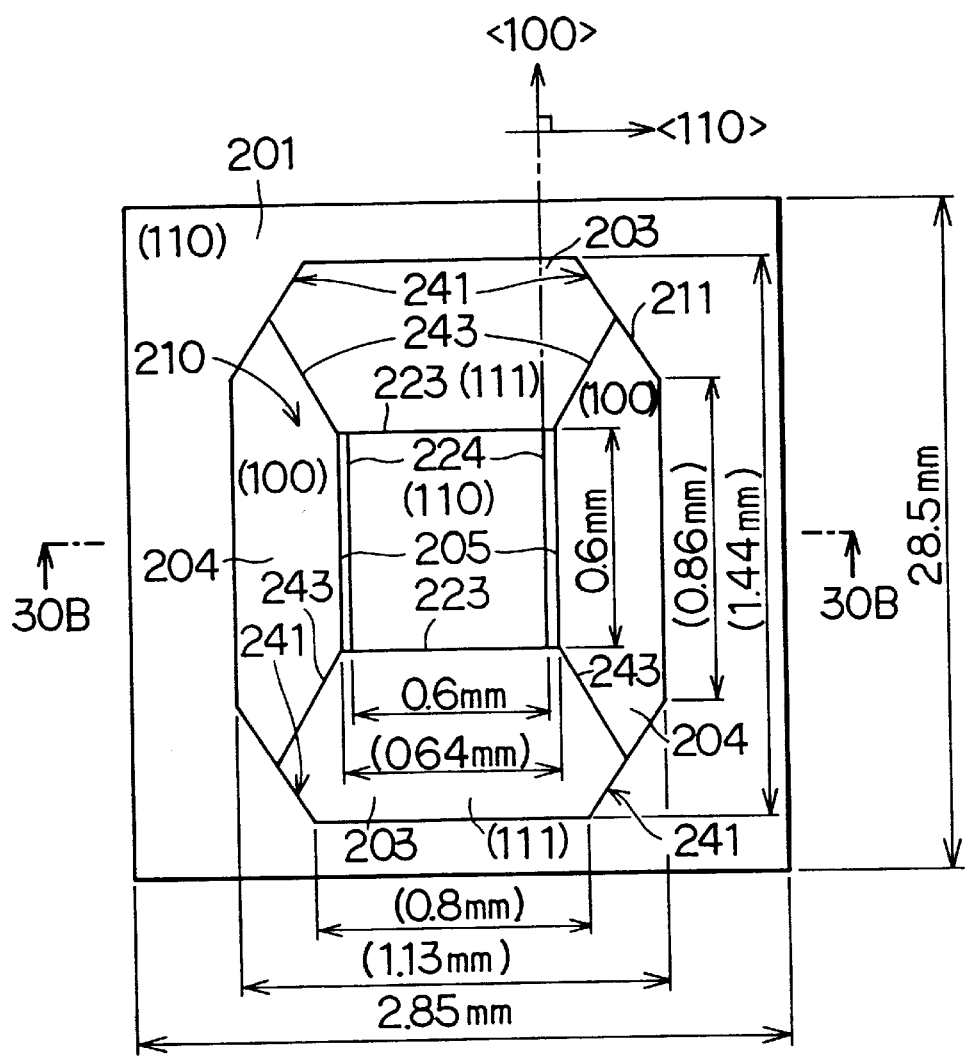
FIGS. 30A and 30B are a plan view for use in describing the orientation and size of the pressure sensor according to the fourth embodiment and a cross-sectional view thereof taken along line 30B—30B of FIG. 30A, respectively.
Figure 30B:
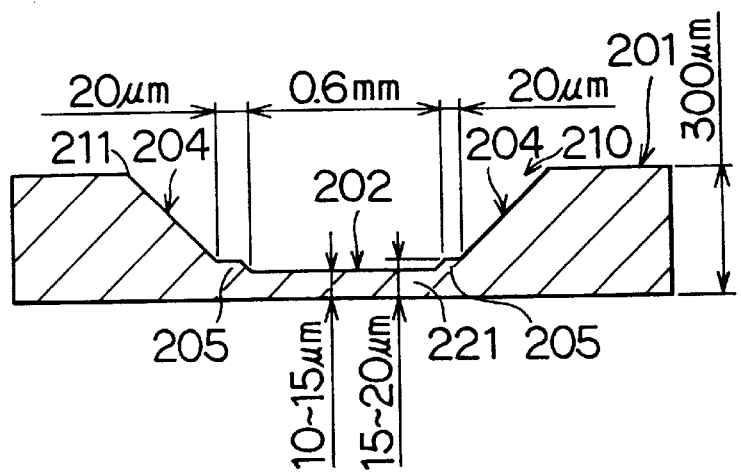

More specifically, as illustrated in FIGS. 30A and 30B, the main surface 201 is a plane with a surface orientation of (110), and each slanting surface forming the concave part 210 has a slanting angles to the main surface 201: approximately 35° for the slanting surfaces 203 with a surface orientation of (111), and approximately 45° for the slanting surface 204 with a surface orientation of (100). The slanting surfaces 203 and 204 meet each other at the corner parts 243 at shallow angles and contact the main surface 201 while forming edges of specified lengths. Therefore, vertical surfaces 241 are formed separately from the bottom surface 202, and the parts of the vertical surfaces 241 are sufficiently thick in the silicon substrate. On the four slanting sides of the octagonal circumferential open edges of the concave part 210 in FIG. 29A are formed the vertical surfaces 241 of small triangle shape respectively.

The surface orientation of the bottom surface 202 is (110), the same surface orientation of the main surface 201. The shape of the bottom surface 202 is a square of 0.6 mm×0.6 mm. Of all the four sides of the bottom surface 202, the sides 223 are in an axial orientation of <110>, and the sides 224 are in an axial orientation of <100>. The level difference parts 205 of approximately 20 $\mu$m in width are formed in contact with the respective sides 224. At the sides 223 meet each other the bottom surface 202 and the slanting surfaces 203, forming corner parts. On the other hand, at the sides 224, the bottom surface 202 and parts (slanting surfaces) of the respective surfaces of the respective level difference parts 205 are in contact with each other, and the level difference parts 205 are in contact with the slanting surfaces 204 respectively at the other side from the bottom surface 202.

The thickness of each part is, as illustrated in FIG. 30B, 300 $\mu$m for the sensor substrate, 10–15 $\mu$m for the thin part 221, and 15–20 $\mu$m for the level difference part 205. The other dimensions are also indicated in FIGS. 30A and 30B.

The semiconductor sensor having the sensor element of such construction as described above according to this embodiment has two functions: a function of releasing stress concentration performed by the level difference parts 205, and a function of preventing cracks possibly caused by the surface orientation and shape of the bottom surface 202 and the axial orientation of each side. Owing to the multiple effect of these two functions, the semiconductor sensor of this embodiment as a pressure sensor has an extremely high break strength.

Figure 31:
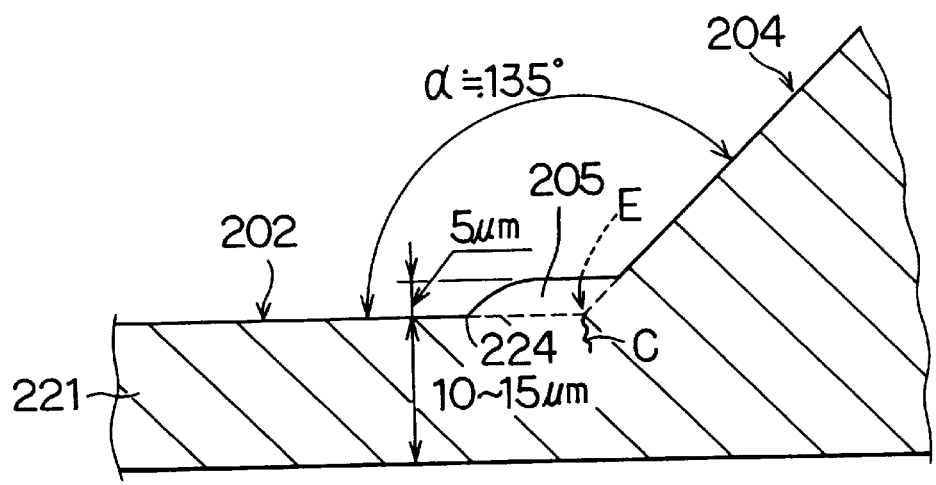
FIG. 31 is a cross-sectional view of an important part illustrating a stress concentration releasing action at a level difference part.

First of all, the level difference part 205 has, as illustrated in FIG. 31, a function of releasing stress concentration at the part where the bottom surface 202 and the slanting surface 204 meet each other.

Specifically, the slanting angle of the slanting surface 204 to the bottom surface 202 is approximately 45° Supposing that the bottom surface 202 and the slanting surface 204 meet each other without interposing the level difference 205 therebetween (as indicated in a broken line in FIG. 31), as the slanting sharply ends at a joint-part (corner part) E, a large stress concentration is caused there and a crack C is caused thereto. Therefore, even if a small stress that does not worthy of the break strength of the thin part 221 causes the circumferential edge part of the thin part 221 to fracture. This means that the thin part 221 has only a small low break strength.

However, with the level difference part 205 formed according to this embodiment, the virtual corner part E is buried in the thickness of the level difference part 205, and thus no strong stress concentration is caused there. As a result, cracks that would start from the two sides 224 of the circumferential edge part of the bottom surface 202 where the level difference parts 205 are formed are prevented, and therefore the two sides 224 can withstand a large stress.

Secondly, it also contributes to the improvement in the break strength of the thin part 221 that the level difference parts 205 are formed not at the two sides 223 where the slanting surfaces 203 meet the bottom surface 202 with a slanting angle of approximately 35° but at the two sides 224 where the slanting surfaces 205 meet the bottom surface 202 with a slanting angle of approximately 45°.

Specifically, although the slanting sharply ends at the side 223 where the bottom surface 202 meets the slanting surface 203, the absolute value of the sharpness is around 35°, far less than 45°. The difference in sharpness is only 10° or so, the effect thereof on the degree of stress concentration is considerable. Therefore, the effect of releasing stress concentration by the level difference part 205 formed at the joint part with the slanting surface 204 having a sharp slanting angle is evidently reflected on the improvement in the break strength.

This can easily be understood by supposing that the level difference part 205 is formed only at the side 223 of the corner part meeting the slanting surface 203 having a slanting angle of approximately 35°. In this supposed case, there is no difference in effect from a case where there is no level difference part 205 formed there, and a crack is preferentially caused to the side 224 meeting the slanting surface 204 having a sharp slanting angle of 45°. Therefore, this supposed case will not contribute to the improvement in the break strength.

Figure 32:
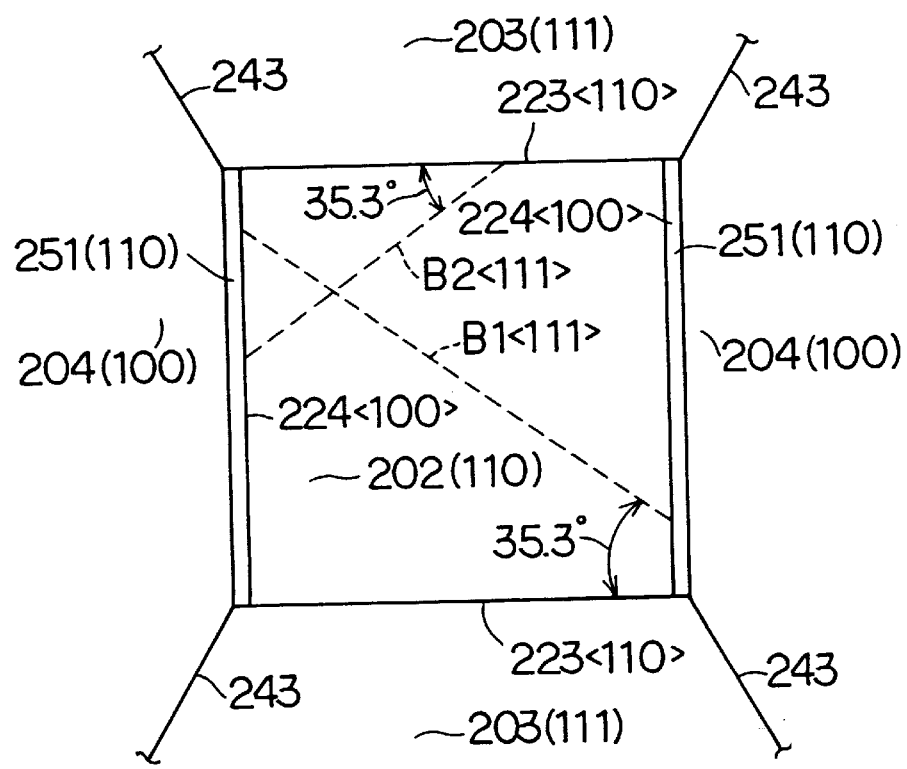
FIG. 32 is a partial plan view illustrating a crack preventive action at a rear surface of the diaphragm.

Thirdly, as illustrated in FIG. 32, the surface orientation (110) of the bottom surface 202 and the axial orientations <110> and <100> of the four sides 223 and 224 respectively also contribute to the improvement in the break strength.

Specifically, the direction in which a crack is most likely to be caused to the bottom surface 202 is an axial orientation of <111>, and there are two different crack lines (tentatively named so) B1, B2 virtually drawn, in FIG. 32, on the bottom surface 202 along which cracks may develop.

When both ends of the crack line meet the level difference parts 205 via the sides 224 as the crack line B1 does, as both end parts of the crack line are hard to be cracked owing to the stress concentration releasing effect of the level difference parts 205, there is no possibility that cracks are easily caused there. Therefore, the break strength of the thin part 202 can be improved.

As another case, even though an end of the crack line meets the level difference part 205 via the side 224, the other end meets the side 223 as the crack line B2 does. In this case, again, cracks will not easily be caused to the one end of the crack line owing to the stress concentration releasing function of the level difference part 205. At the other end of the crack line, although there is no level difference part formed at the side 223 meeting the slanting surface 203, the incident angle of the crack line B2 to the side 223 is as small as approximately 35°. Therefore, as the slanting angle of the slanting surface 203 along the crack line B2 is only approximately 20° (i.e., 35.3°×sin (35.3°) =20.4°), the occurrence of cracks due to stress concentration around the side 223 along the crack line B2 is suppressed.

Accordingly, according to the semiconductor pressure sensor of this embodiment, as a crack will not easily be caused to around the bottom surface 202 of the sensor substrate, there is an effect that the break strength of the thin part 221 can be improved.

The semiconductor pressure sensor of this embodiment can be manufactured by a manufacturing method with a masking process, the first etching process and the second etching process as described below.

Masking Process

The base material to be used for the manufacture of the substrate described above is a semiconductor wafer of 300 μm thick composed of monocrystalline silicon. The main surface 201 and the back surface 206 of this wafer are planes having a surface orientation of (110).

Figure 33:
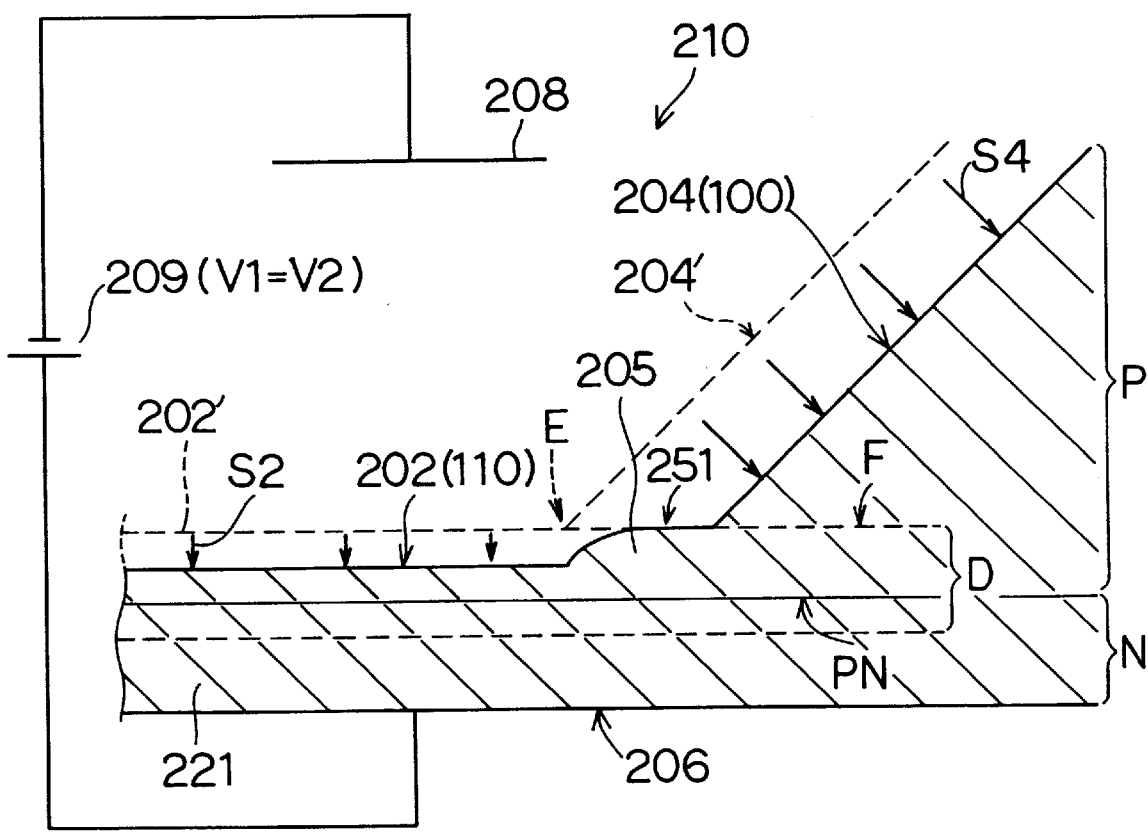
FIG. 33 is a view for use in describing a manufacturing method of the fourth embodiment.

The wafer is, as illustrated in FIG. 33, composed of a P-type semiconductor layer P on the side of the main surface 201 and an N-type semiconductor layer N on the side of the back surface 206. The N-type semiconductor layer N is an epitaxial layer of approximately 10 μm thick. A depletion layer D is created within the wafer with an PN junction interface PN interposed therein.

In the masking process, a mask made of silicon nitride film (SiN) is formed on the main surface 201. This mask has a plurality of rectangular open parts of length (<100>-direction) 1.42 mm×breadth (<110>-direction) 0.74 mm each. These open parts are laid out lengthwise and breadthwise, and a single wafer has as many concave parts 210 as the number of the open parts.

On the back surface 206 of the wafer is formed a metallic film (not illustrated) so that the voltage application thereto can be uniform.

First Etching Process

In the first etching process, the substrate with the mask formed on the main surface 201 as described above is immersed in the anisotropic etchant contained in the etching container (FIG. 16) and subjected to anisotropic wet etching to form concave parts on the mask opened parts described above.

The etching container is, as described in the description of the third embodiment, so constructed that the etchant, the pure water and the nitrogen gas can be supplied and discharged. Therefore, precise temperature control and stirring can be provided to the etchant. As the etchant, KOH solution (33 wt %), which is an alkali anisotropic etchant, is used. The etchant is maintained at a liquid temperature of 110° C. during this process.

In this process, as illustrated in FIG. 33, anisotropic etching processing is performed with a specified voltage (10V) applied from a DC power source 209. The voltage is applied to between a platinum electrode 208 and the back surface 206 of the wafer in such a way that reverse bias electric field can be applied to the PN junction PN. As a result, the depletion layer D becomes thicker, and a boundary part (boundary surface) F of the depletion layer D extends to the side of the main surface 201 from the position with no voltage application.

When the anisotropic etching has reached the boundary part F, the generation of the anodic oxide film on the etching surface begins, the etching speed becomes suddenly and extremely slow into a stop etching state. The processing time until reaching this state (i.e., the processing time of the first etching process) is around 35 minutes. At this time, by controlling the extent of overetching amount, as described in the description of the above embodiments, the concave parts and convex parts of an etching surface 202' are smoothed and the etching surface 202' becomes parallel to the bottom surface 202.

By this stage, the etching surface 202' parallel to the bottom surface 202 and an etching surface 204' parallel to the slanting surface 204 have been formed, and the corner parts E where the circumferential slanting surfaces (204', etc.) meet each other have been formed at the four sides of the etching surface 202'. Here, the etching surface 202', which is identical to the bottom surface of the concave part, has been formed in a rectangular shape surrounded by the four sides in parallel to the four sides of the mask opened parts and along axial orientations of approximately <100> and approximately <110>.

Second Etching Process In the second etching process, continuously following the previous first etching process, etching processing is taken over on the same conditions.

Specifically, in this process, the wafer is further anisotropically etched for a specified time (around 3 minutes). As illustrated in FIG. 33, as etching speed S2 toward the (110)-oriented bottom surface 202 is extremely slow, the etching surface does not proceed so much, and the bottom surface 202 is formed. At this time, the bottom surface 202 is further smoothed.

On the other hand, as the (100)-oriented slanting surface 204' has electric potential lower than the passivation voltage, etching speed S4 in the slanting surface direction is not slowed so much. Therefore the etching surface advances comparatively deeply, and the slanting surface 204 is formed. However, when the etching surface reaches the depletion layer D, the etching speed suddenly slows, and as a result, the level difference part 205 having a gently curved convex part on a surface 251 against the space of the concave part 210 is formed at the joint part between the bottom surface 202 and the slanting surface 204. In this way, adjacently to the pair of side 224 (having an axial orientation of <100>) facing each other of all the circumferential part surrounding the bottom surface 202 of the concave part 210, the level difference part 205 with a specified width (around 20 μm) is formed.

It should be noted here that the etching speed toward the (111)-oriented slanting surface 203 is as extremely slow as the etching speed S2 toward the (110)-oriented bottom surface 202. For this reason, there is practically no level difference part formed between the bottom surface 202 and the slanting surface 203, and the bottom surface 202 and the slanting surface 203 meet each other direct at the side 223 (FIG. 29C).

Subsequent Process

The wafer with the concave part 210 formed into a specified shape through the processing described above is cleaned with the pure water. Then, the wafer is subjected to the mask removing, base joining processing and dicing. After these subsequent well-known processes, the semiconductor pressure sensor of this embodiment is finished.

As detailed above, according to the manufacturing method of the semiconductor sensor of this embodiment, by providing the anisotropic etching utilizing the electrochemical stop etching, it is possible to easily manufacture the semiconductor pressure sensor with a remarkably improved break strength.

Furthermore, by applying the manufacturing method of this embodiment, a semiconductor sensor having a cantilever-like thin part (instead of diaphragm), such as acceleration sensor and angular velocity sensor, can be manufactured. In this case, the level difference part should preferably be formed at the root part of the cantilever.

Figure 34:
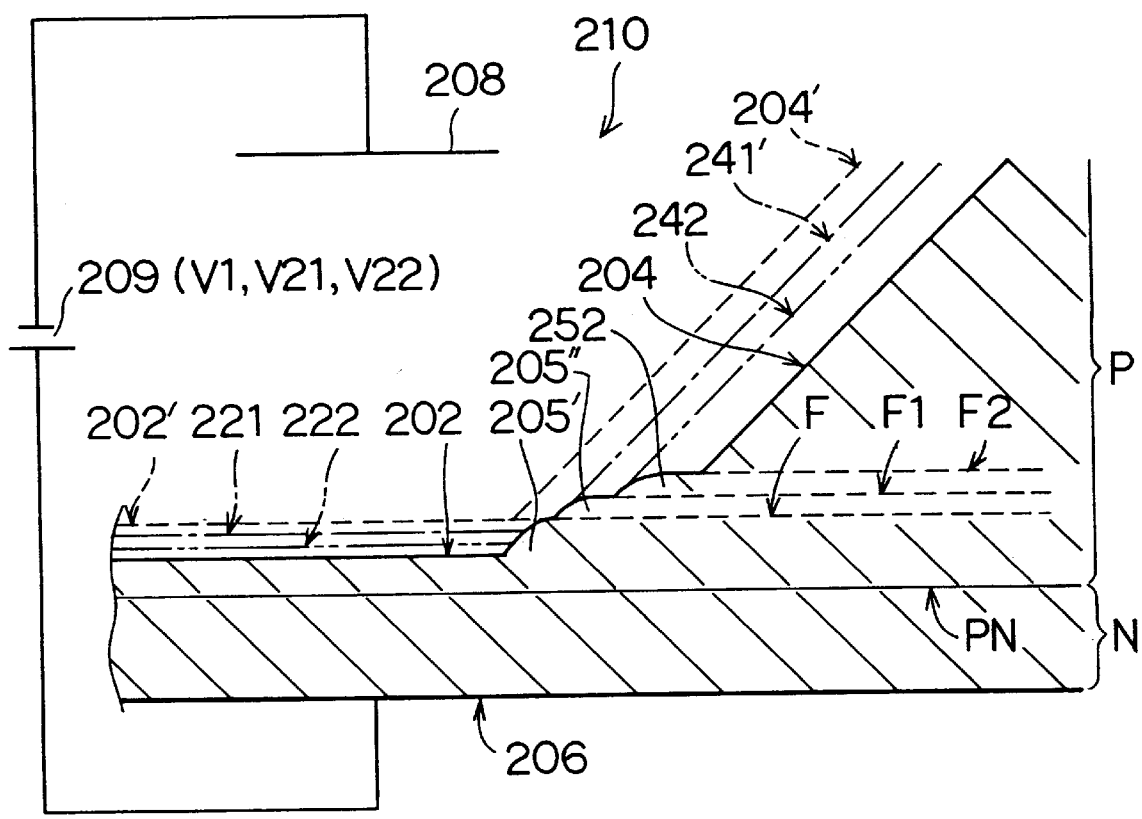
FIG. 34 is a view for use in describing a manufacturing method of an application example of the fourth embodiment.

In the above fourth embodiment, the application voltage may be varied in the second etching process. That is, in the first etching process, as illustrated in FIG. 34, application voltage (first voltage) V1 is applied to form the etching surfaces 202' and 204' in the same way as the fourth embodiment.

The second voltage to be applied in the second etching process is equal to the first voltage V1 in the first part of this process, and by the stop etching in a position of the boundary surface F of the depletion layer D, the etching surfaces 221 and 241' are formed. Upon the completion of these etching surfaces 221 and 241', the second voltage is switched to higher voltage V21, the boundary surface of the depletion layer D rises to a position of F1 (toward the main surface 201), and etching surfaces 222 and 242 having a new level difference part 205" are formed. In the same way, upon the formation of the etching surfaces 222 and 242, the second voltage is switched to still higher voltage V22, the boundary surface of the depletion layer D rises to a position of F2, and etching surfaces 202 and 204 having a new level difference part 252 are formed.

As described above, by increasing the application voltage by multiple switchings in the second etching process, multiple level difference parts 205', 205" and 252 (multi-tiers structure) are formed in tiers. By the formation of the multiple level difference parts 205', 205" and 252, stress concentration at this parts can further be released, and therefore the break strength of the substrate can further be improved.

Therefore, according to the manufacturing method of this applied example, there is an effect that a semiconductor sensor having a further improved break strength can be manufactured.

Incidentally, in the second etching process, only one switching of the application voltage from the first voltage V1 to the second voltage V2 can give an improvement effect to the break strength.

Figure 35:
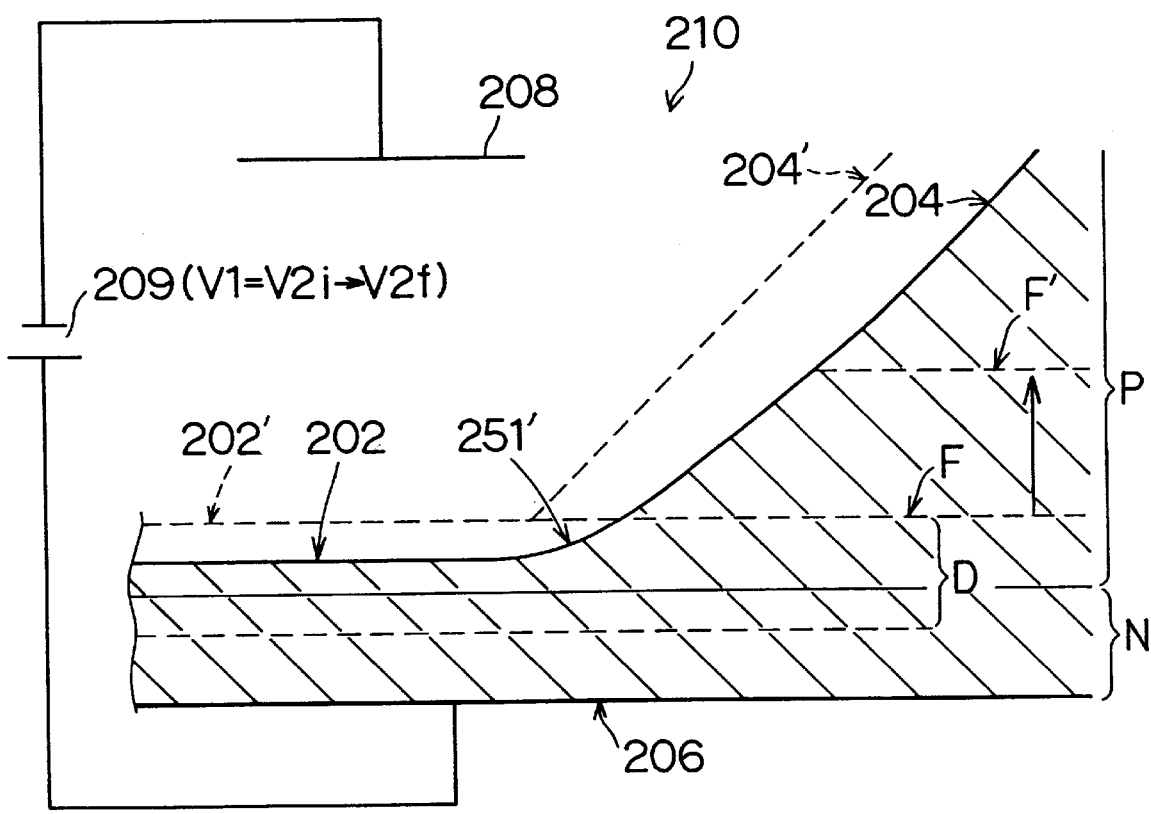
FIG. 35 is a view for use in describing a manufacturing method of another application example of the fourth embodiment.

Furthermore, the second voltage V2 to be applied in the second etching process may be controlled for stepless and continuous increase with the first voltage V1 taken as the initial value V2$i$ of the second voltage V2. That is, the second voltage V2 is steplessly and continuously increased throughout the second etching process to the final voltage V2$f$, which is considerably high, to terminate this process. With the increase in the second voltage V2, as illustrated in FIG. 35, the boundary surface F of the depletion layer D also steplessly and continuously rises to a position of F'.

Therefore, the level difference part 251' formed by the electrochemical etching is also almost steplessly and continuously formed. So much so that, according to the manufacturing method of this applied example, there is an effect that a substrate, or a semiconductor sensor having a still higher break strength can be manufactured.

Fifth Embodiment

It is a characteristic of this embodiment that in each of the above-described embodiments, after forming a diaphragm by electrochemical etching, lightly etching by means of isotropic etching is applied to the diaphragm to curve the back surface thereof.

In the following paragraphs, the fifth embodiment will be described referring to an example which this embodiment is applied to the fourth embodiment as a typical example.

Figure 36:
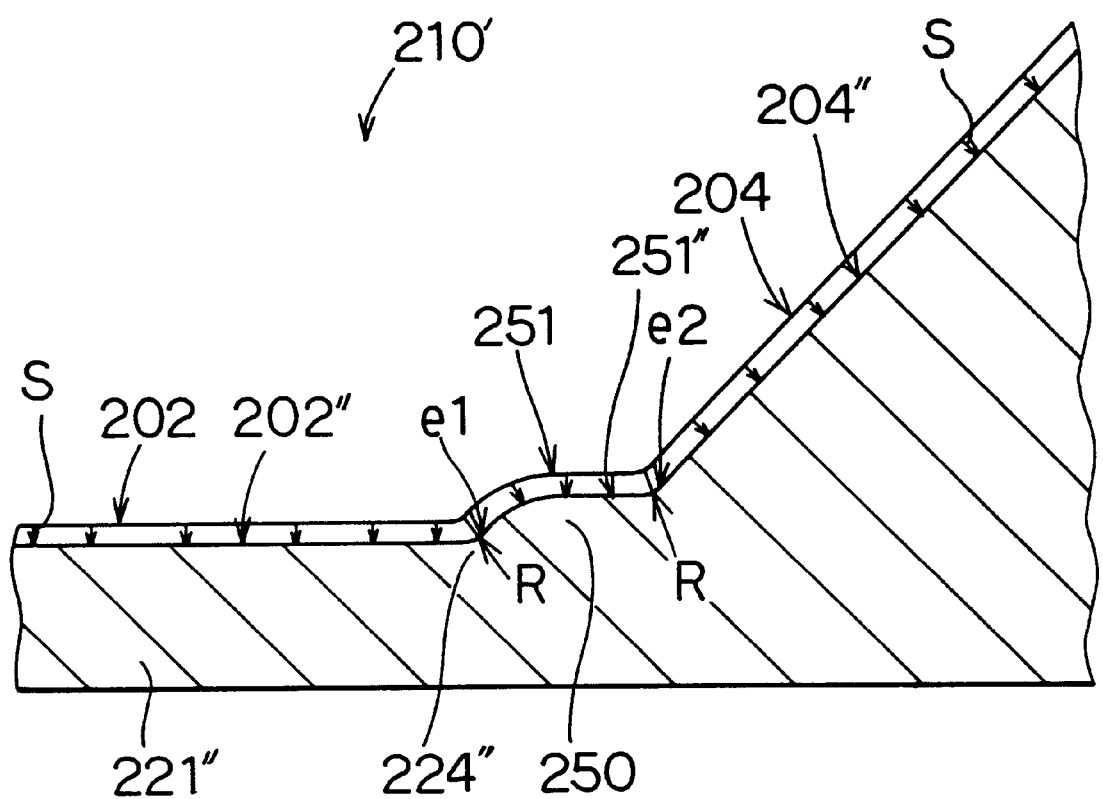
FIG. 36 is a view for use in describing a manufacturing method of a fifth embodiment.
Figure 37A:
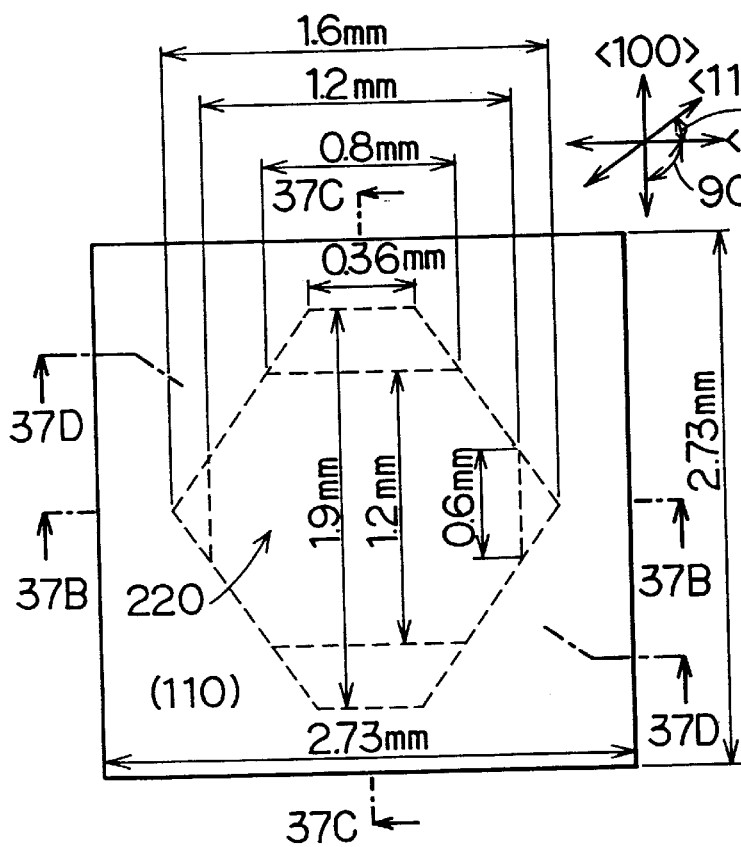
FIGS. 37A, 37B, 37C and 37D are a plan view of a pressure sensor having the conventional octagonal diaphragm, a cross-sectional view thereof taken along line 37B—37B of FIG. 37A, a cross-sectional view thereof taken along line 37C—37C of FIG. 37A, and a cross-sectional view thereof taken along line 37D—37D of FIG. 37A, respectively.
Figure 37C:
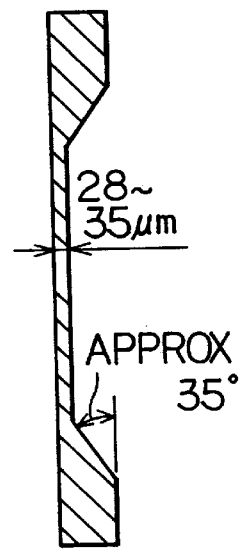
Figure 37B:
Figure 37D:
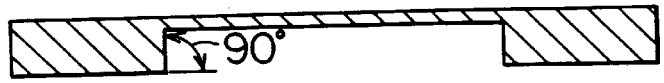

A semiconductor sensor as the fifth embodiment has, as illustrated in FIG. 36, a sensor substrate with a level difference part 250 formed at the boundary between a bottom surface 202" and a slanting surface 204".

The substrate of this embodiment is the same in crystal direction and almost the same in shape and dimensions as the substrate of the fourth embodiment. This embodiment is different, however, from the fourth embodiment in that all the corner parts where a plurality of surfaces forming a concave part 210', such as the circumferential edge part of the bottom surface 202" including the level difference parts 250, (1–2 $\mu$m larger in each part than the concave part 210 of the fourth embodiment), are curved. Even in the fourth embodiment, the corner part E is rounded to some extent. In this embodiment, however, by means of isotropic etching (described later), the corner part is further rounded.

That is, four sides 223" (not illustrated) and 224" of the bottom surface 202" of the square are curved. At around the level difference part 250, as illustrated in FIG. 36, corner parts e1 and e2 where two surfaces meet each other at an angle are formed with concave surfaces having a radius of curvature R of 1–2 $\mu$m each. Also all the other corner parts within the concave part 210' are formed with concave parts having a radius of curvature of 1–2 $\mu$m each.

According to the construction of the substrate of this embodiment, the concave part 210', including the four sides 223" and 224" of the bottom surface 202", has no square concave part (corner part). Therefore, at any corner part, stress concentration can further be released.

Accordingly, in this embodiment, break strength against cracks that may be caused from four directions of the thin part 221" of the sensor substrate can further be improved to such an extent as to be near the original break strength proper to the thin part 221" itself. As a result, according to the semiconductor sensor of this embodiment, there is an effect that the break strength can remarkably be improved over the fourth embodiment.

The substrate of this embodiment (FIG. 36) is manufactured utilizing the substrate manufactured in the fourth embodiment as the base material. specifically, after the completion of the second etching process in the fourth embodiment described above, in the third etching in this embodiment, the substrate is immersed in the isotropic etchant for approximately 20 seconds and subjected to an etching of around 1–2 $\mu$m. In this etching, the etchant used is a mixture of each solution of $HNO_3$ (70%), HF (49%) and CHCOOH (99.5%) at a ratio of 45:2:3 respectively, and the temperature of the etchant is approximately 22° C.

By the third etching process described above, the concave part 210 of the substrate is isotropically etched to around 1–2 $\mu$m, and all the corner parts are curved to be concave surfaces of a radius of curvature R of 1–2 $\mu$m each. As a result, the substrate having a remarkably high break strength is manufactured.

Therefore, according to the manufacturing method of this embodiment, there is an effect that the semiconductor sensor having a remarkably improved break strength as described above can be manufactured.

For the purpose of evaluating the break strengths of the sensor substrate according to the fourth embodiment and the sensor substrate according to the fifth embodiment, these sensor substrates were subjected to hydrostatic fracture tests.

As comparison objects, a plurality of sensor substrates were manufactured according to the prior art (U.S. Pat. No. 5,289,721) and tested together. The sensor substrate according to the prior art has, as illustrated in FIGS. 37A through 37D, an octagonal thin part 220, and the shape and dimensions thereof were those illustrated in FIGS. 37A through 37D. In comparison with this prior art, also tested and data gathered was a substrate which has an octagonal diaphragm configuration similar to FIGS. 37A through 37D but is subjected to the same isotropic etching as the third etching process of the fifth embodiment.

As a result, as illustrated in FIG. 38, the fourth embodiment and fifth embodiment according to the present invention showed a remarkable effect of break strength improvement. In this figure, one dot corresponds to one testing data, and the number of specimens of octagonal diaphragm construction is 10, the number of specimens of the fourth embodiment is 20, and the number of specimens of the fifth embodiment is 23.

Specifically, the break strengths of the specimens of such structure as illustrated in FIGS. 37A through 37D were at most around 15–20 [$kgf/cm^2$], and even in a case where the isotropic etching is performed thereon, the break strength thereof increases at most around 40–45 [$kgf/cm^2$]. However, the break strengths of the specimens of the fourth embodiment were around 50–80 [$kgf/cm^2$], showing some improvements. Furthermore, the break strengths of the specimens of the fifth embodiment were 140–195 [$kgf/cm^2$], showing remarkable improvements.

From the above test results, the effect owing to the formation of the level difference parts at the corner parts of the diaphragm is evident. That is, a semiconductor sensor having an unprecedentedly extremely high break strength (fracture load) can be provided. Of course, it is needless to say that even such a construction that has the octagonal thin part 220, as illustrated in FIGS. 39A through 39D, can improve the break strength thereof by forming the level difference parts 250. According to such construction, in addition to the improvement in the break strength, it is expected to reduce the variation (unevenness) in thermal stress around the outer edges of the thin part 220, and there is an effect that erroneous thermal output can be reduced.

For the information purpose only, the present invention is not limited to each of the above embodiments. For example, the etchant is not limited to the KOH solution but tetramethylammonium hydroxide (TMAH: $(CH_3)_4NOH$), ethylenediamine or other alkali anisotropic etchant may also be used.

Moreover, the present invention may be so arranged that, after immersing a (110)-oriented silicon wafer in an etchant without applying voltage to form a concave part, which serves as diaphragm for example, by using a time management, the bottom surface of the formed concave part on which irregularities are formed due to the nature of the (110)-oriented silicon as shown in FIG. 5 for example is smoothed by applying voltage to the silicon wafer within the etchant to conduct the electrochemical etching.

In each of the above embodiments, the formation of the diaphragm for a semiconductor pressure sensor has been described. However, each of the above embodiments can be used for the formation of a thin part (beam) of a semiconductor acceleration sensor or other case.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A etching method for silicon substrate, comprising:
   etching a (110)-oriented silicon substrate having a PN junction using anisotropic etchant, said etching including etching said (110)-oriented silicon substrate by means of an electrochemical etching method performed reversely biasing said PN junction; and
   stopping a voltage application for said electrochemical etching method at a time when a first specified time passes after a rate of formation of an anodic oxide film is equilibrated with a rate of etching of said anodic oxide film on an etching surface proximate to said PN junction.

2. An etching method for silicon substrate according to claim 1, wherein a point of time when the equilibrium state is obtained is a point of inflection of flowing current which is detected to constant current after a peak thereof.

3. An etching method for silicon substrate according to claim 2, wherein the point of inflection is regarded as a point of time when a second specified time after the peak of the detected flowing current has lapsed.

4. An etching method for silicon substrate according to claim 1, wherein said first specified time is set to 5 minutes or more.

5. An etching method for silicon substrate according to claim 1, wherein said voltage application during said first specified time from the point of time when the equilibrium state is obtained uses alternating current wave.

6. An etching method for silicon substrate according to claim 5, where a cycle of said alternating current wave is selected in association with a time required for removing all said anodic oxide film from said etching surface by using said anisotropic etchant.

7. An etching method for semiconductor substrate, comprising:
   forming a mask having a specified open part on a main surface of a substrate composed of a monocrystalline semiconductor, said substrate having therein a PN junction parallel to said main surface;
   first anisotropically etching said substrate to a boundary part with a depletion layer created within said substrate and thereby forming a concave part having a bottom surface approximately parallel to said main surface and circumferentially surrounded by slanting surfaces; and
   further anisotropically etching said substrate and thereby forming level difference parts within the slanting surfaces, parallel to said main surface, and having specified widths at least at a pair of sides of slanting surfaces facing each other of circumferential edge part surrounding said bottom surface of said concave part.

8. An etching method for semiconductor substrate according to claim 7, wherein:
   said forming a mask comprises forming a mask having said open part of rectangular shape surrounded by four sides respectively having an axial orientation of approximately <100> and approximately <110> on said main surface having a surface orientation of approximately (100); and
   said first anisotropically etching comprises anisotropically etching said substrate and thereby shaping said bottom surface into a rectangle surrounded by four sides having an axial orientation of approximately <100> and approximately <110>, respectively.

9. An etching method for semiconductor substrate according to claim 8, wherein said further anisotropically etching comprises forming said level difference parts at a pair of sides having an axial orientation of approximately <100>.

10. An etching method for semiconductor substrate according to claim 7, wherein at least one of said first anisotropically etching and said further anisotropically etching comprises a wet etching process for immersing said substrate in anisotropic etchant and thereby etching said substrate.

11. An etching method for semiconductor substrate according to claim 10, wherein said wet etching process comprises anisotropically etching said substrate by using an electrode in contact with said anisotropic etchant and applying voltage between said electrode and said substrate.

12. An etching method for semiconductor substrate according to claim 11, wherein:
   said first etching and said further etching are said wet etching processes; and
   a first voltage and a further voltage applied in said first etching and said further etching, respectively, are different from each other,
   whereby said further voltage applied in said second etching is selected to move said boundary part of said depletion layer from a position of said boundary part determined in said first etching toward said main surface to thereby form said level difference parts.

13. An etching method for semiconductor substrate according to claim 12, wherein:
   said first etching and said further etching are continuously performed; and
   said further etching step comprises varying said second voltage steplessly and continuously or in multiple steps.

14. An etching method for semiconductor substrate according to claim 7, further comprising immersing said substrate in isotropic etchant for a specified time after said further etching to thereby round corner parts of said bottom surface.

* * * * *